US012598983B2

(12) United States Patent
Lanzillo et al.

(10) Patent No.: US 12,598,983 B2
(45) Date of Patent: Apr. 7, 2026

(54) INTERCONNECTS FORMED USING INTEGRATED DAMASCENE AND SUBTRACTIVE ETCH PROCESSING

(71) Applicant: International Business Machines Corporation, Armonk, NY (US)

(72) Inventors: Nicholas Anthony Lanzillo, Wynantskill, NY (US); Huai Huang, Clifton Park, NY (US); Hosadurga Shobha, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 905 days.

(21) Appl. No.: 17/524,107

(22) Filed: Nov. 11, 2021

(65) Prior Publication Data

US 2023/0146512 A1    May 11, 2023

(51) Int. Cl.
| | |
|---|---|
| *H01L 23/528* | (2006.01) |
| *H01L 21/768* | (2006.01) |
| *H01L 23/522* | (2006.01) |
| *H01L 23/532* | (2006.01) |

(52) U.S. Cl.
CPC .... *H01L 23/5283* (2013.01); *H01L 21/76804* (2013.01); *H01L 21/76807* (2013.01); *H01L 21/76885* (2013.01); *H01L 23/5226* (2013.01); *H01L 23/53238* (2013.01); *H01L 23/53295* (2013.01); *H01L 21/76897* (2013.01)

(58) Field of Classification Search
CPC ......... H01L 21/76804; H01L 21/76897; H01L 23/5226; H01L 21/76807; H01L 23/53295
See application file for complete search history.

(56) References Cited

U.S. PATENT DOCUMENTS 7,489,220 B2    2/2009   Baumgartner et al.
7,642,619 B2 *  1/2010   Matz ................... H01L 23/5222
                                                                        257/528

(Continued)

FOREIGN PATENT DOCUMENTS

| CN | 108475625 A | 8/2018 |
|---|---|---|
| EP | 3017471 B1 | 3/2020 |
| TW | 201546959 A | 12/2015 |

OTHER PUBLICATIONS

U.S. Appl. No. 16/941,860 filed in the name of Brent Anderson et al. filed Jul. 29, 2020, and entitled "Subtractive Line with Damascene Second Line Type."

*Primary Examiner* — William B Partridge
*Assistant Examiner* — Alexandre X Ramirez
(74) *Attorney, Agent, or Firm* — L. Jeffrey Kelly; Ryan, Mason & Lewis, LLP

(57) ABSTRACT

A semiconductor structure comprises two or more interconnect lines of a first width in a given interconnect level, and two or more interconnect lines of a second width in the given interconnect level. The two or more interconnect lines of the second width are disposed between a first one of the two or more interconnect lines of the first width and a second one of the two or more interconnect lines of the second width. The two or more interconnect lines of the first width have sidewalls with a negative taper angle. The two or more interconnect lines of the second width have sidewalls with a positive taper angle.

20 Claims, 20 Drawing Sheets

(56) References Cited

U.S. PATENT DOCUMENTS

| | | | | |
|---|---|---|---|---|
| 7,709,905 B2* | 5/2010 | McDevitt | H01L 23/5221 | |
| | | | 438/678 | |
| 8,617,982 B2 | 12/2013 | Danek et al. | | |
| 9,391,019 B2 | 7/2016 | Kobrinsky et al. | | |
| 9,502,350 B1* | 11/2016 | Bonilla | H01L 23/53228 | |
| 9,524,933 B2 | 12/2016 | Zhang et al. | | |
| 9,601,426 B1 | 3/2017 | Bonilla et al. | | |
| 9,613,861 B2 | 4/2017 | Anderson et al. | | |
| 9,805,976 B2 | 10/2017 | Shaviv et al. | | |
| 9,966,336 B2 | 5/2018 | Yu et al. | | |
| 10,256,186 B2 | 4/2019 | Bonilla et al. | | |
| 10,319,908 B2 | 6/2019 | Narayanan et al. | | |
| 10,727,294 B2 | 7/2020 | Chiou et al. | | |
| 11,404,373 B2* | 8/2022 | Bao | H01L 23/53257 | |
| 2003/0042611 A1* | 3/2003 | Mori | H01L 23/528 | |
| | | | 257/E23.151 | |
| 2007/0045850 A1* | 3/2007 | Nogami | H01L 23/53238 | |
| | | | 438/622 | |
| 2007/0212872 A1 | 9/2007 | Daubenspeck et al. | | |
| 2009/0200683 A1* | 8/2009 | Colburn | H01L 21/76813 | |
| | | | 257/774 | |
| 2015/0179513 A1* | 6/2015 | Myers | H01L 23/5226 | |
| | | | 257/774 | |
| 2015/0187699 A1* | 7/2015 | Baek | H01L 23/53223 | |
| | | | 257/773 | |
| 2018/0164698 A1* | 6/2018 | Yang | H01L 21/7682 | |
| 2018/0174894 A1* | 6/2018 | Bouche | H01L 21/308 | |
| 2019/0139887 A1* | 5/2019 | Lin | H01L 21/76831 | |
| 2020/0381356 A1* | 12/2020 | Tsai | H01L 21/76802 | |
| 2021/0167006 A1* | 6/2021 | Bao | H01L 23/5283 | |
| 2022/0045003 A1* | 2/2022 | Bae | H01L 21/76829 | |

* cited by examiner

INTEGRATED CIRCUIT                                    2610

INTERCONNECTS FORMED USING HYBRID DAMASCENE
AND SUBTRACTIVE ETCH INTEGRATION PROCESSING

2600

INTERCONNECTS FORMED USING INTEGRATED DAMASCENE AND SUBTRACTIVE ETCH PROCESSING

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming interconnect lines using integrated hybrid damascene and subtractive etch processing.

In one embodiment, a semiconductor structure comprises two or more interconnect lines of a first width in a given interconnect level, and two or more interconnect lines of a second width in the given interconnect level. The two or more interconnect lines of the second width are disposed between a first one of the two or more interconnect lines of the first width and a second one of the two or more interconnect lines of the second width. The two or more interconnect lines of the first width have sidewalls with a negative taper angle. The two or more interconnect lines of the second width have sidewalls with a positive taper angle.

In another embodiment, an integrated circuit comprises a back-end-of-line interconnect structure comprising two or more interconnect levels. At least a given one of the two or more interconnect levels comprises two or more interconnect lines of a first width and two or more interconnect lines of a second width. The two or more interconnect lines of the second width are disposed between a first one of the two or more interconnect lines of the first width and a second one of the two or more interconnect lines of the second width. The two or more interconnect lines of the first width have sidewalls with a negative taper angle. The two or more interconnect lines of the second width have sidewalls with a positive taper angle.

In another embodiment, a method comprises forming two or more interconnect lines of a first width in a given interconnect level, and forming two or more interconnect lines of a second width in the given interconnect level. The two or more interconnect lines of the second width are disposed between a first one of the two or more interconnect lines of the first width and a second one of the two or more interconnect lines of the second width. The two or more interconnect lines of the first width have sidewalls with a negative taper angle. The two or more interconnect lines of the second width have sidewalls with a positive taper angle.

These and other features and advantages of embodiments described herein will become more apparent from the accompanying drawings and the following detailed description.

BRIEF DESCRIPTION OF THE DRAWINGS

FIG. 16 depicts density improvements provided using hybrid damascene and subtractive etch processing integration for wide and narrow lines, according to an embodiment of the invention.

DETAILED DESCRIPTION

Figure 1:
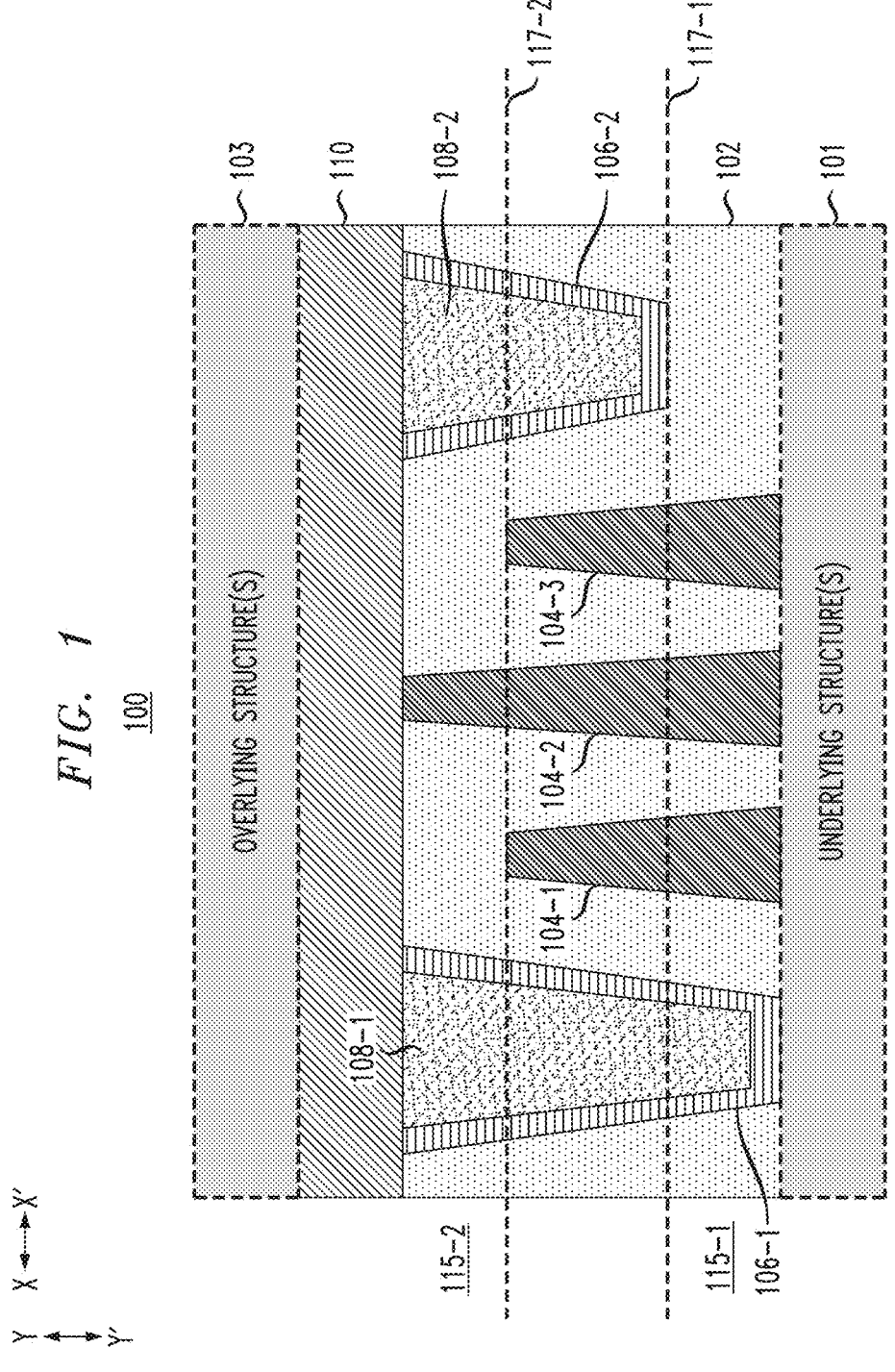
FIG. 1 depicts a cross-sectional view of a semiconductor structure providing hybrid damascene and subtractive etch processing integration for wide and narrow lines, according to an embodiment of the invention.

Illustrative embodiments of the invention may be described herein in the context of illustrative methods for forming interconnect lines using integrated hybrid damascene and subtractive etch processing, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Back-end-of-line (BEOL) interconnect structures may use a wide range of critical dimension (CD). BEOL interconnect structures may be formed using copper (Cu). As the metal CD goes down, however, the conductivity of Cu drops. Accordingly, there is a need for the use of alternate materials for forming BEOL interconnect structures as devices continue to scale. Alternate materials, such as ruthenium (Ru) and cobalt (Co), can match Cu effective resistivity (resistance and area product) as devices continue to scale to 30 nanometer (nm) pitch and below with a minimal capacitance loss. BEOL interconnects or lines may include "narrow" and "wide" lines, where the wide lines are three times (3×), five times (5×), ten times (10×), etc. the width of the narrow lines. Although Ru/Co can match the effective resistivity of Cu, wide line resistance with Ru/Co remains high which can negatively impact device performance. Thus, there is a need for techniques which enable formation of narrow lines and wide lines with different materials (e.g., Ru/Co for narrow lines, and Cu for wide lines).

Illustrative embodiments provide standard cell libraries with hybrid signal and power line interconnect metallization. In some embodiments, standard cell architectures are provided with two power lines and N adjacent signal lines between the two power lines, where the N adjacent signal lines have a subtractive-etch profile, while the two power lines at the cell boundary have damascene profiles.

Conventional structures may have all lines formed using subtractive etching or all lines formed using damascene processing. Some other conventional structures have alternating lines having damascene and subtractive-etch profiles, but do not provide cell architectures with multiple nested signal lines having subtractive-etch profiles surrounded by power lines with damascene profiles. Still other conventional structures use different metal materials in via and line regions but do not enable the use of different metal materials for narrow and wide lines within a same metallization level.

Some embodiments provide techniques for forming standard cell architectures including non-planar line and via interfaces. For example, top via structures may be coincident with power lines, and dual damascene via structures may be coincident with signal lines. The standard cell architectures or modules may be located either above or below a single damascene cell or module, or a dual damascene cell or module. Thus, the standard cell architectures described herein are fully compatible with BEOL processing. As will be described in further detail below, some embodiments provide techniques for forming "top vias" above subtractively patterned narrow lines and for forming "bottom vias" below damascene patterned wide lines. Conventional structures fail to enable formation of such "top via" structures for narrow lines while also using damascene patterning for wide lines within the same metal level. Conventional structures also fail to provide non-planar interfaces between vias and lines.

Advantageously, illustrative embodiments provide co-integration of narrow lines (e.g., signal lines) formed using subtractive etch processing and wide lines (e.g., power lines) formed using damascene processing within the same metal level and within the same standard cell. Thus, the line resistance can be optimized for both the narrow lines (e.g., signal lines) and wide lines (e.g., power lines). The narrow lines, formed using substrative etch processing, have a distinct profile relative to the power lines formed using damascene processing. For example, the narrow lines and wide lines have distinct taper angles (e.g., the narrow lines taper upwards and are narrower at their top surfaces than their bottom surfaces, while the wide lines taper downwards and are wider at their top surfaces than their bottom surfaces). Further, as described above and elsewhere herein, there may be non-planar line and via interfaces for the narrow (e.g., signal) and wide (e.g., power) lines. The narrow lines may have top vias, while the wide lines have bottom vias. For high-performance applications, it is desired to utilize subtractively-formed interconnects (e.g., for signal lines). The techniques described herein enable formation of narrow (e.g., signal) lines using subtractive etch processing while also enabling a low-resistance solution for wide (e.g., power) lines.

FIG. 1 shows a cross-sectional view 100 of a semiconductor structure providing a standard cell architecture utilizing hybrid subtractive etch and damascene processing for formation of narrow and wide lines. The FIG. 1 structure includes an interlevel dielectric (ILD) layer 102 formed over one or more underlying structures 101 and below one or more overlying structures 103. The underlying structures 101 and overlying structures 103 may comprise additional modules or standard cell architectures (e.g., providing one or more via and interconnect levels of an overall BEOL structure), active devices, etc. In various figures below, the underlying structures 101 and overlying structures 103 are omitted for clarity of illustration.

The FIG. 1 structure also includes a set of narrow lines 104-1, 104-2 and 104-3 (collectively, narrow lines 104) formed within the ILD layer 102 using subtractive etching (the narrow lines 104 may be formed first, followed by fill of the ILD layer 102 as described in further detail below). The FIG. 1 structure further includes wide lines 108-1 and 108-2 (collectively, wide lines 108) formed within the ILD layer 102 using damascene processing. The wide lines 108-1 and 108-2 include respective barrier layers 106-1 and 106-2 (collectively, barrier layers 106). A dielectric capping layer 110 is formed over the ILD layer 102, the wide lines 108, and the narrow line 104-2. The ILD layer 102 provides a single metallization layer for a standard cell that includes the multiple narrow lines 104 formed between the wide lines 108. It should be noted that while FIG. 1 shows an example with three narrow lines 104, this is not a requirement. More generally, the standard cell architecture includes N narrow lines 104 between the wide lines 108, where N≥2.

The ILD layer 102 may be formed of any suitable isolating material, such as $SiO_2$, SiOC, SiON, etc. The ILD layer 102 has a width (in direction X-X') sufficient to surround the narrow lines 104 and wide lines 108 which are formed, and a height (in direction Y-Y') that matches the overall height of the wide line 108-1 and its associated barrier layer 106-1.

The narrow lines 104 may be formed of Ru, Co or another suitable material. Each of the narrow lines 104 has a width (in direction X-X') at its bottom surface in the range of 5-15 nm, and a width (in direction X-X') at its top surface also in the range of 5-15 nm, but smaller than the bottom surface width. As illustrated, the narrow lines 104 taper such that the width at their top surfaces is smaller than the width at their bottom surfaces. Two of the narrow lines 104-1 and 104-3, have heights (in direction Y-Y') in the range of twice their respective widths (e.g., 10-30 nm if the widths are 5-15 nm), while the narrow line 104-2 has a height (in direction Y-Y') in the range of 20-45 nm (e.g., 10-30 nm height of the line portion, plus 10-15 nm height of the top via structure). The increased height of narrow line 104-2 (e.g., in the region 115-2 above the second dashed line 117-2) provides a "top via" region for the narrow line 104-2.

The barrier layers 106 may be formed of tantalum (Ta), tantalum nitride (TaN) or another suitable material. The barrier layers 106 may have a uniform thickness in the range of 1-3 nm.

The wide lines 108 may be formed of Cu or another suitable material. Each of the wide lines 108 has a width (in direction X-X') at its bottom and top surface that is in some multiple range of the width of the narrow lines 104. In some embodiments, it is assumed that the wide lines 108 are assumed to have a "3×" size width as compared with the narrow lines 104 having a "1×" size width. Thus, if the narrow lines 104 have a width (in direction X-X') in the range of 5-15 nm, then the wide lines 108 would have a width (in direction X-X') in the range of 15-45 nm. The bottom surfaces of the wide lines 108 are smaller than the top surfaces. For example, the top surfaces of the wide lines 108 may have widths (in direction X-X') in the range of 20-50 nm while the bottom surfaces of the wide lines 108 may have widths (in direction X-X') in the range of 10-40 nm. As illustrated, the wide lines 108 taper such that the width at their top surfaces is greater than the width at their bottom surfaces. In some embodiments, it is assumed that the wide lines 108 are assumed to have a "3×" size width as compared with the narrow lines 104 having a "1×" size width. The wide line 108-1 has a height (in direction Y-Y') in the range of 10-30 nm (e.g., a height similar to that of the narrow lines 104-1 and 104-3), and the wide line 108-2 has a height (in direction Y-Y') in the range of 20-45 nm (e.g., a height similar to that of the narrow line 104-2). The increased height of the wide line 108-1 (e.g., in the region 115-1 below the first dashed line 117-1) provides a "bottom via" region for the wide line 108-1.

The dielectric capping layer 110 may be formed of any suitable dielectric material, including but not limited to silicon nitride (SiN), silicon carbide (SiC), aluminum nitride (AlN), aluminum oxide (AlO), combinations thereof (e.g., bilayers or trilayers of several of such materials), etc. The dielectric capping layer 110 may have a height (in direction Y-Y') of approximately 10 nm or less.

Figure 2:
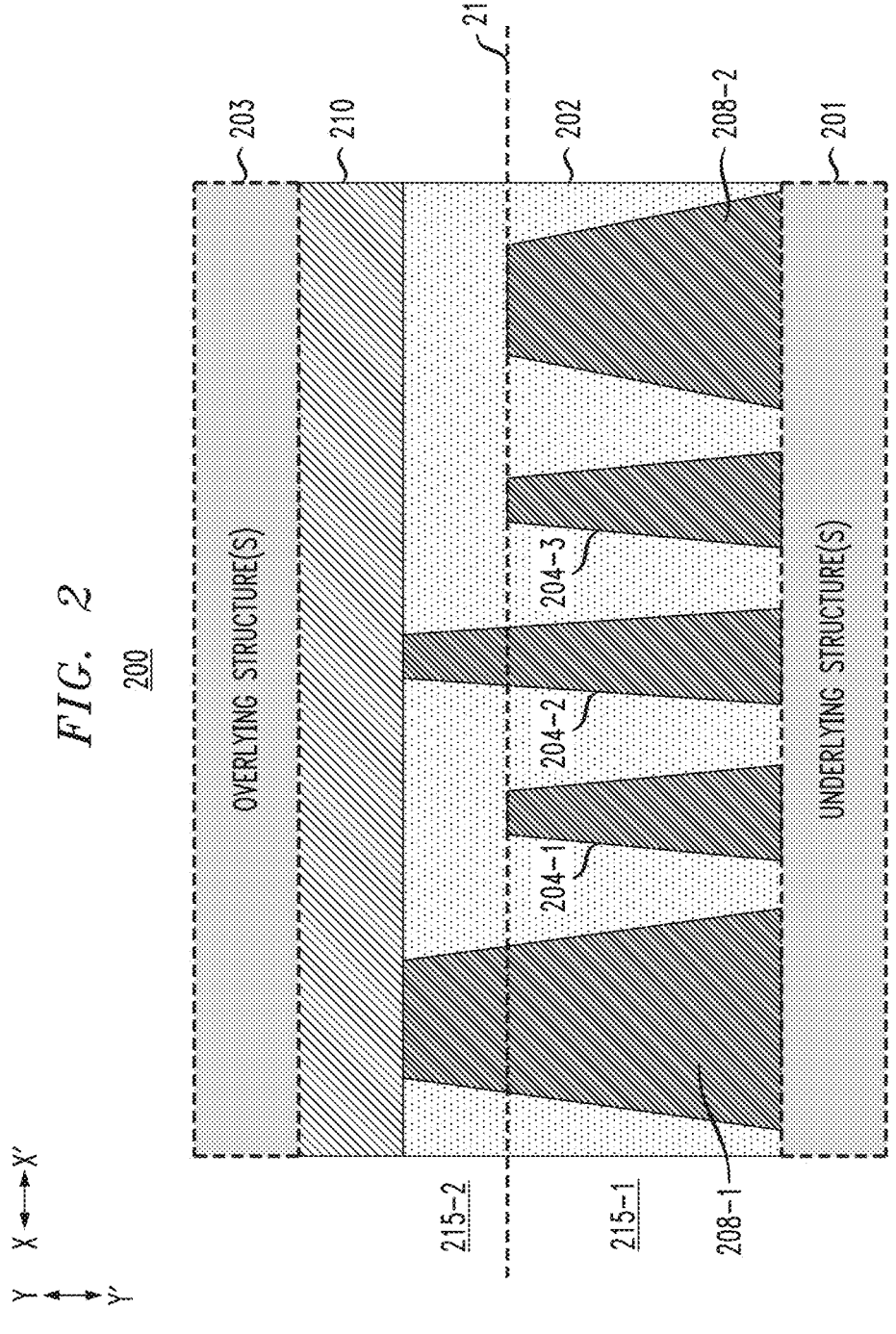
FIG. 2 depicts a cross-sectional view of a semiconductor structure utilizing subtractive etching for formation of both wide and narrow lines, according to an embodiment of the invention.

FIG. 2 shows a cross-sectional view 200 of a semiconductor structure providing a standard cell architecture, which used subtractive etch processing for formation of both narrow and wide lines. The FIG. 2 structure includes an ILD layer 202 formed over one or more underlying structures 201 and below one or more overlying structures 203. The underlying structures 201 and overlying structures 203 may comprise additional modules or standard cell architectures (e.g., providing one or more via and interconnect levels of an overall BEOL structure), active devices, etc. In various figures below, the underlying structures 201 and overlying structures 203 are omitted for clarity of illustration.

The FIG. 2 structure also includes a set of narrow lines 204-1, 204-2 and 204-3 (collectively, narrow lines 204) formed within the ILD layer 202 using subtractive etching. It should be noted that the narrow lines 204 may be formed first, followed by fill of the ILD layer 202 as described in further detail below. The FIG. 2 structure further includes wide lines 208-1 and 208-2 (collectively, wide lines 208) also formed using subtractive etching. A dielectric capping layer 210 is formed over the ILD layer 202, narrow lines 204 and wide lines 208. Whereas in the FIG. 1 structure the narrow lines 104 and wide lines 108 are formed of different materials (e.g., Ru/Co for the narrow lines 104 and Cu for the wide lines 108), in the FIG. 2 structure the narrow lines 204 and wide lines 208 are formed of the same material (e.g., Ru/Co). While this material may be acceptable for signal lines (e.g., narrow lines 204), for power lines (e.g., wide lines 208) the use of Ru/Co provides a big resistance penalty. Thus, the FIG. 2 structure has various disadvantages as a result of subtractive etch processing being used for both the signal lines (e.g., narrow lines 204) and the power lines (e.g., wide lines 208), where there is a large resistance penalty in the power lines (e.g., wide lines 208) since Ru/Co only provides a resistance benefit at very small line areas (e.g., the 1× width of the narrow lines 204). In the FIG. 2 structure, portions of the narrow lines 204 and wide lines 208 below line 217 (e.g., in region 215-1) provide line regions while portions of the narrow line 204-2 and wide line 208-1 above the line 217 (e.g., in region 215-2) provide via regions.

Figure 3A:
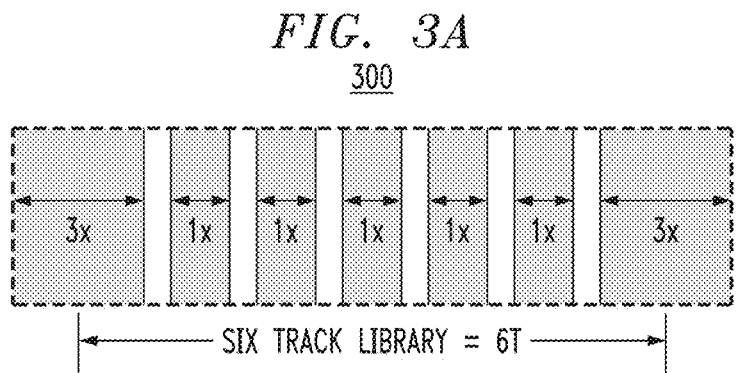
FIG. 3A depicts a top-down view of a six track library cell, according to an embodiment of the invention.
Figure 3B:
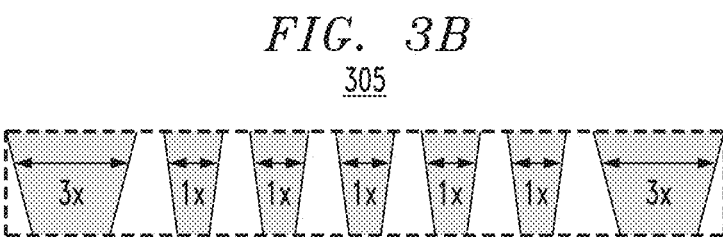
FIG. 3B depicts a cross-sectional view of the FIG. 3A six track library cell, according to an embodiment of the invention.
Figure 3C:
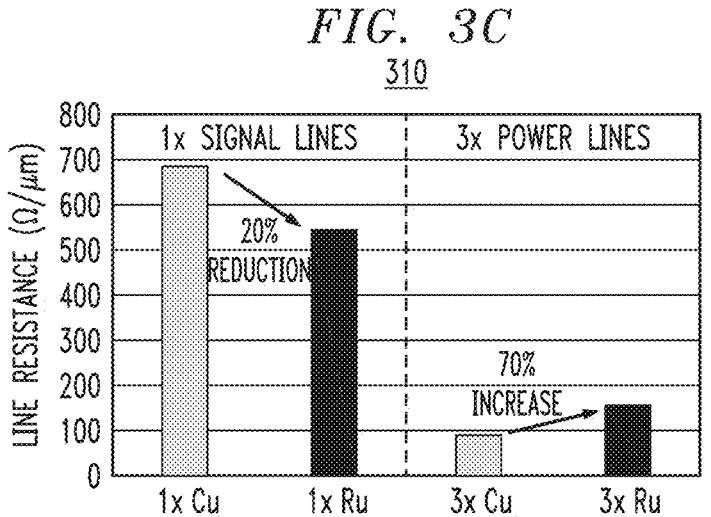
FIG. 3C depicts a plot of line resistance values for different materials used in wide and narrow lines for the six track library cell shown in FIGS. 3A and 3B, according to an embodiment of the invention.

Non-Cu conductors such as Ru or Co result in a resistance benefit relative to Cu in narrow lines (e.g., with 1× width) but have a resistance penalty for wide lines (e.g., with 3× width). Illustrative embodiments provide techniques for simultaneously optimizing the resistance of both narrow lines (e.g., signal lines) and wide lines (e.g., power lines). FIGS. 3A-3C illustrate the relationship between resistance for different materials used in narrow and wide lines. FIG. 3A shows a top-down or layout view 300 of a six transistor (6T) standard cell at an M1 metallization level, which includes a six track library having two 3× width wide lines and five 1× width narrow lines nested between the two 3× width wide lines. FIG. 3B also shows a cross-sectional view 305 of the 6T standard cell at the M1 metallization level, where the wide lines are 3× width power lines and the narrow lines are 1× width minimum pitch signal lines. FIG. 3C further shows a plot 310 of line resistance, in ohms per micrometer ($\Omega/\mu m$), for narrow (e.g., 1× width) and wide (e.g., 3× width) lines formed using Cu and Ru. For narrow lines (e.g., 1× width), Ru provides a 20% reduction in the line resistance. For wide lines (e.g., 3× width), Ru has a 70% increase in the line resistance. It should be noted that these particular values assume a 24 nm minimum pitch, 12 nm critical dimension (CD), and an aspect ratio of 2, where the Cu includes a barrier or liner of 2 nm physical vapor deposition (PVD) TaN and 2 nm chemical vapor deposition Co, and where the Ru includes a barrier or liner of 1 nm atomic layer deposition (ALD) titanium nitride (TiN).

Alternative or non-Cu conductors, such as Ru and Co, result in lower line resistance than Cu in minimum-pitch (e.g., 1× width) interconnects but a higher line resistance than Cu in wider lines (e.g., 3× width). The wide lines may be used as power lines. High power line resistance results in large IR drop, which leads to reliability issues and limits chip performance. Illustrative embodiments introduce new masking steps to simultaneously integrate subtractively-patterned narrow lines (e.g., 1× width lines formed of a non-Cu material such as Ru or Co) with damascene patterned wide lines (e.g., 3× width lines formed of Cu) within the same metal level and within the same standard cell. Thus, embodiments can simultaneously minimize both narrow (e.g., 1× width) and wide (e.g., >1× width) line resistance, where narrow lines may be used for signal lines and wide lines may be used for power lines. In some embodiments "top via" and "bottom via" regions are formed within the same metal level above the narrow lines and below the wide lines, respectively.

As shown in FIG. 1, some embodiments provide simultaneous top and bottom via region formation with substrative etch and dual damascene processing within the same module. Dual damascene wide lines 108 (e.g., for power lines), such as wide line 108-1, can have vias below the line 117-1 in a given metallization level (e.g., Mx). The subtractive narrow lines 104 (e.g., for signal lines), such as narrow line 104-2, can have vias above the line 117-2 within the same metallization level (e.g., Mx). The power lines (e.g., wide lines 108) may be made of Cu, which is best for low resistance in lines with >1× width (e.g., 2×-3× width) while the signal lines (e.g., narrow lines 104) are made of a non-Cu material such as Ru or Co which is best for low resistance in lines with 1× width (e.g., a minimum line width).

FIGS. 4-10 show a process flow for forming the standard cell architecture structure of FIG. 1.

Figure 4:
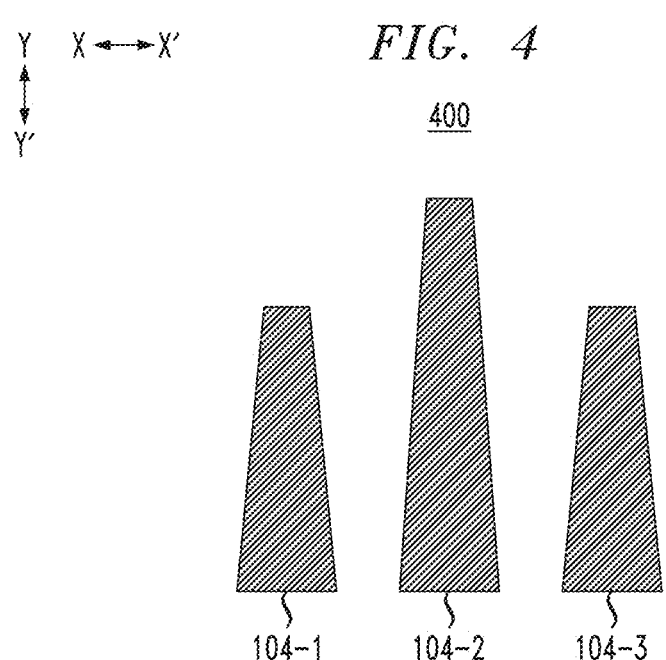
FIG. 4 depicts a cross-sectional view of a semiconductor structure following subtractive etching formation of narrow lines, according to an embodiment of the invention.

FIG. 4 shows a cross sectional view 400 of subtractive line formation of the narrow lines 104. Initially, a material of the narrow lines 104 (e.g., Ru) may be blanket deposited, followed by subtractive etch processing which forms the narrow lines 104, including the top via region for narrow line 104-2 (e.g., in the region 115-2 of narrow line 104-2 above the line 117-2 shown in FIG. 1).

Figure 5:
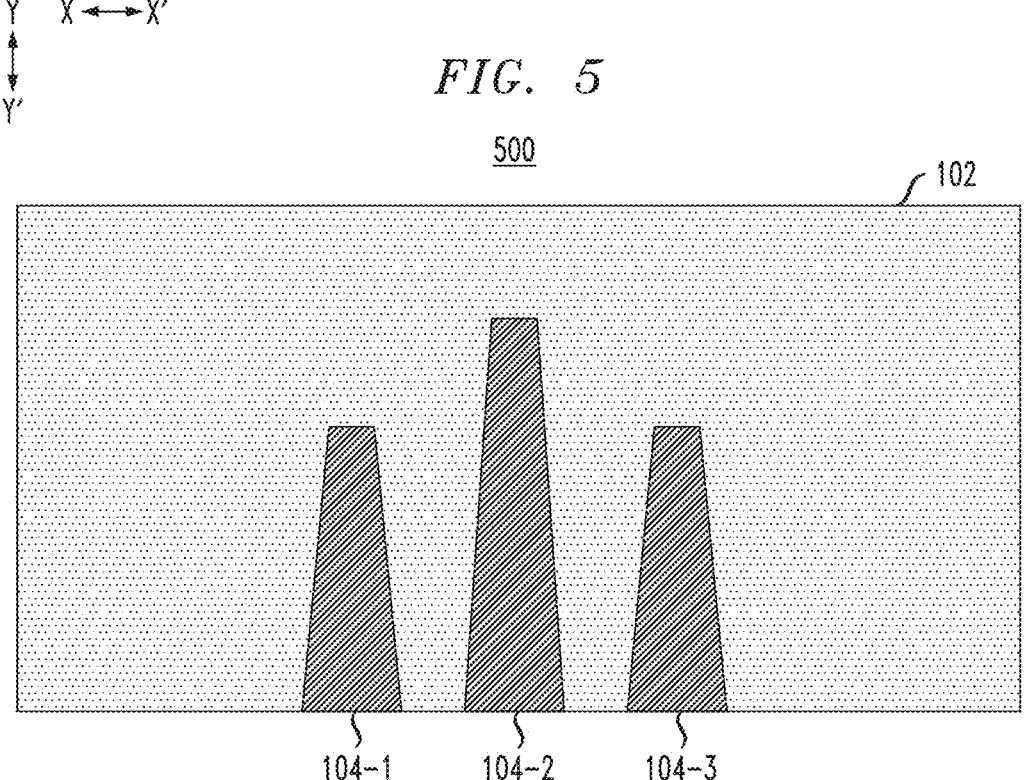
FIG. 5 depicts a cross-sectional view of the FIG. 4 structure following deposition of an interlevel dielectric layer, according to an embodiment of the invention.

FIG. 5 shows a cross-sectional view 500 of the FIG. 4 structure following formation of the ILD layer 102. The ILD layer 102 is formed to overfill the structure. The ILD layer 102 may be formed using any suitable deposition technique.

Figure 6:
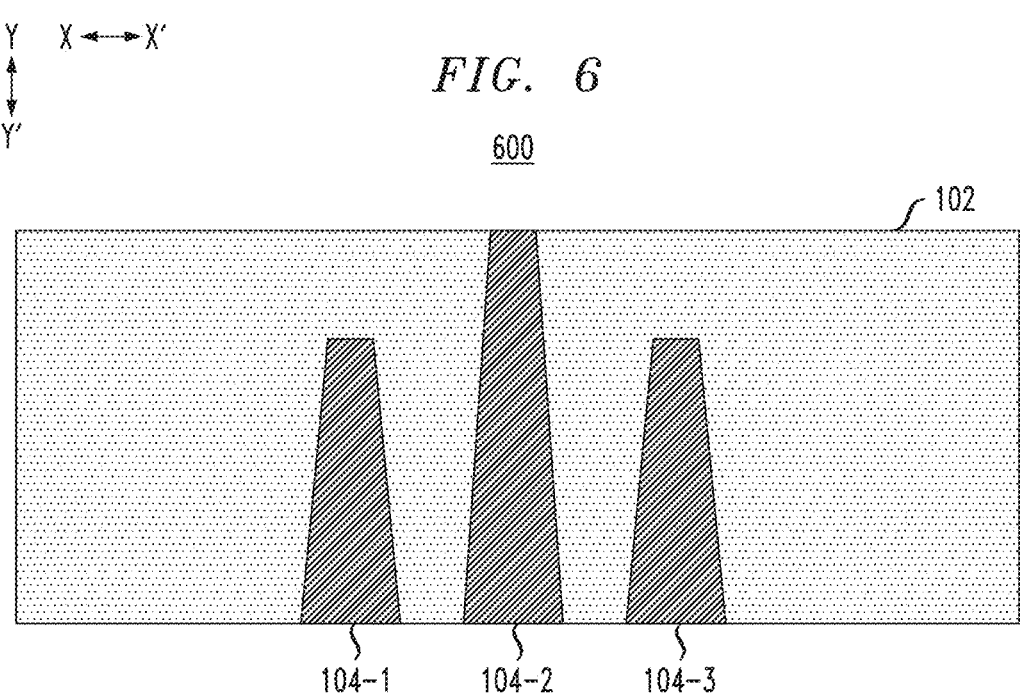
FIG. 6 depicts a cross-sectional view of the FIG. 5 structure following planarization of the interlevel dielectric layer, according to an embodiment of the invention.

FIG. 6 shows a cross-sectional view 600 of the FIG. 5 structure following chemical mechanical planarization (CMP) processing. The CMP processing exposes the top via of narrow line 104-2 as illustrated.

Figure 7:
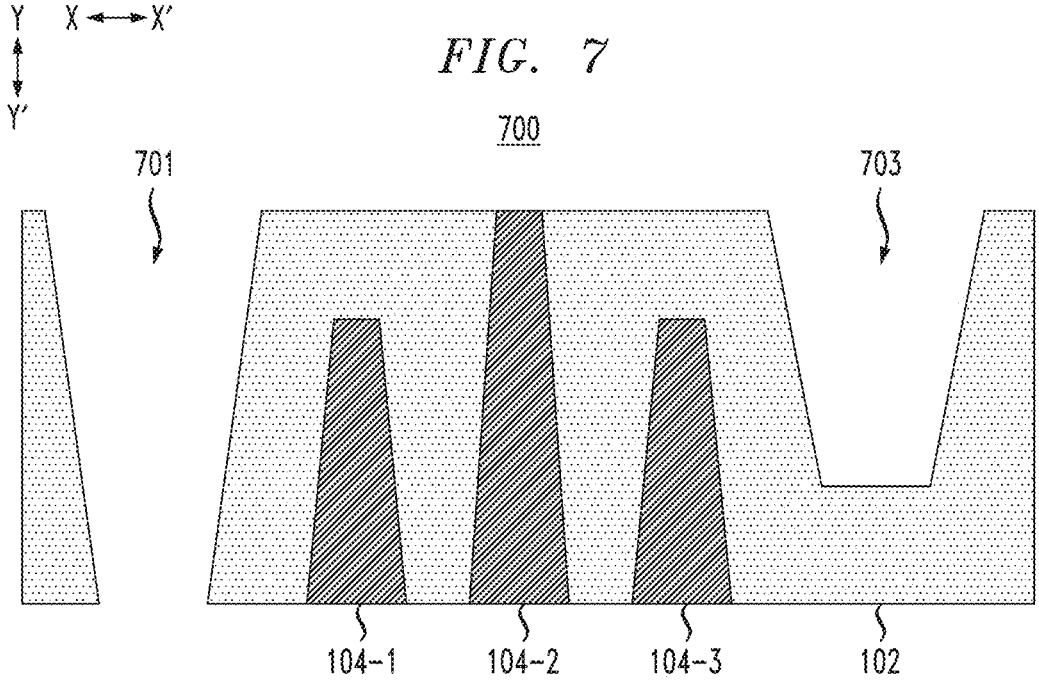
FIG. 7 depicts a cross-sectional view of the FIG. 6 structure following formation of trenches for wide lines, according to an embodiment of the invention.

FIG. 7 shows a cross-sectional view 700 of the FIG. 6 structure following formation of trenches 701 and 703 for the wide lines 108. The trenches 701 and 703 may be formed using lithography and etch processing. In some embodiments, a separate mask is used to form the bottom via region below the wide line 108-1 (e.g., in the region 115-1 below the line 117-1). A portion of the trench 701 and the trench 703 is formed using a first mask, followed by use of a second mask which exposes trench 701 but not 703 to form the remainder of trench 701 providing the bottom via region of wide line 108-1.

Figure 8:
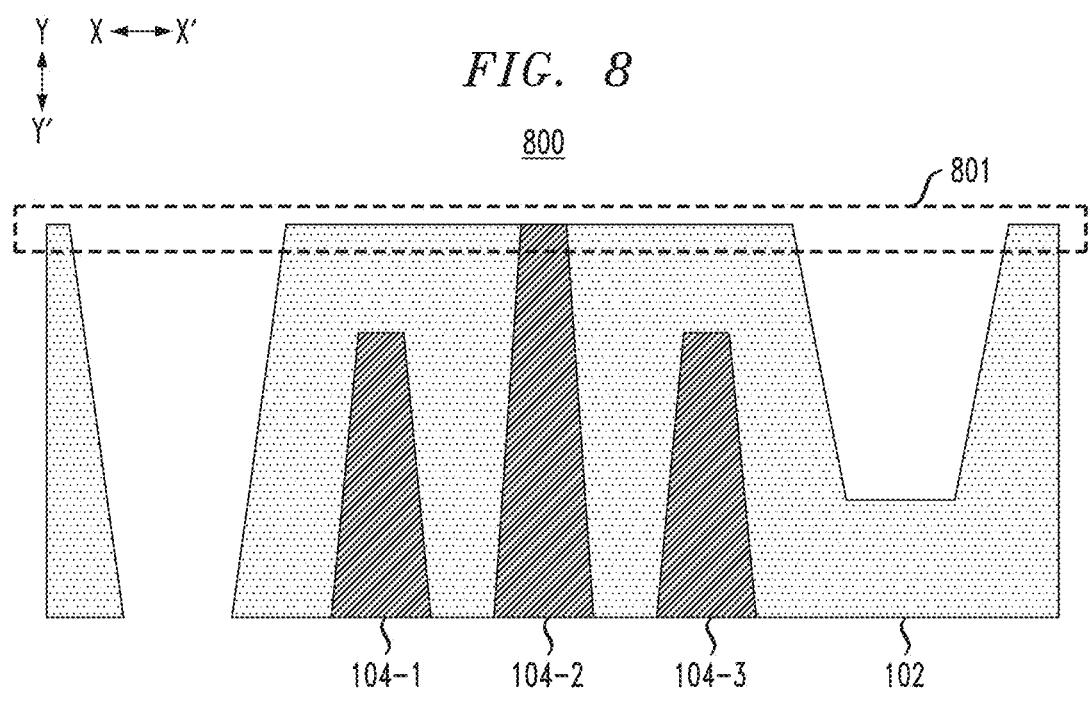
FIG. 8 depicts a cross-sectional view of the FIG. 7 structure following optional wet clean processing, according to an embodiment of the invention.

FIG. 8 shows a cross-sectional view 800 of the FIG. 7 structure following optional wet clean processing 801. The wet clean processing 801 is used for exposed portions of the narrow lines 104 (in this example, the top via region of narrow line 104-2).

Figure 9:
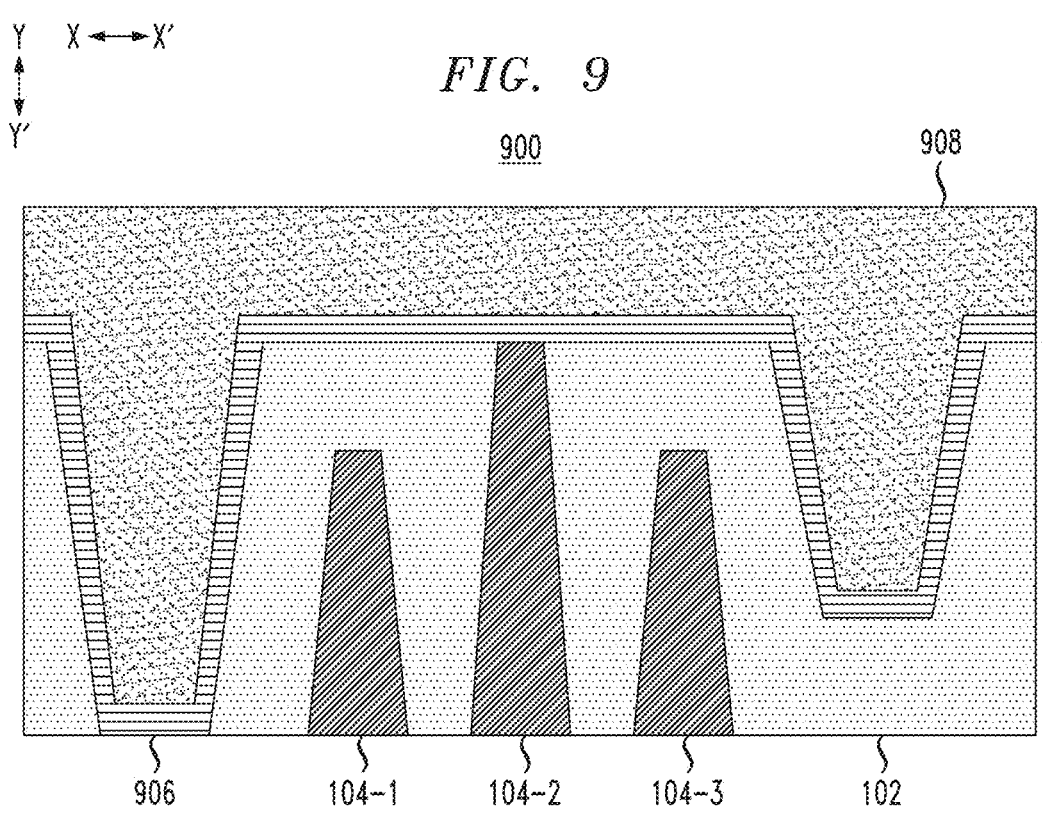
FIG. 9 depicts a cross-sectional view of the FIG. 8 structure following formation of a barrier material and wide line material, according to an embodiment of the invention.

FIG. 9 shows a cross-sectional view 900 of the FIG. 8 structure following formation of material 906 of the barrier layers 106 and material 908 of the wide lines 108. The material 906 may be formed initially using a conformal deposition process, followed by formation of the material 908. The material 908 may be formed using a Cu electro-plating fill process.

Figure 10:
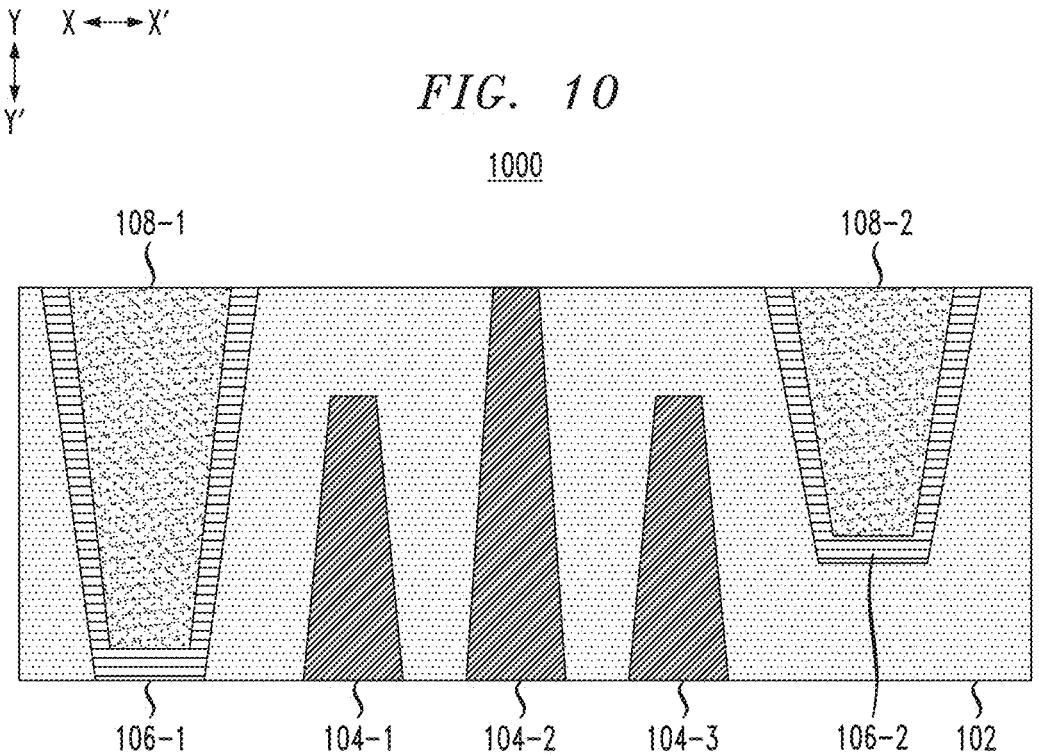
FIG. 10 depicts a cross-sectional view of the FIG. 9 structure following planarization to form wide lines from the barrier material and wide line material, according to an embodiment of the invention.

FIG. 10 shows a cross-sectional view 1000 of the FIG. 9 structure following CMP to remove portions of the material 906 and 908 that overfill the structure (e.g., CMP stops on the top of the narrow line 104-2). The dielectric capping layer 110 may then be deposited to result in the structure shown in FIG. 1.

Figure 11:
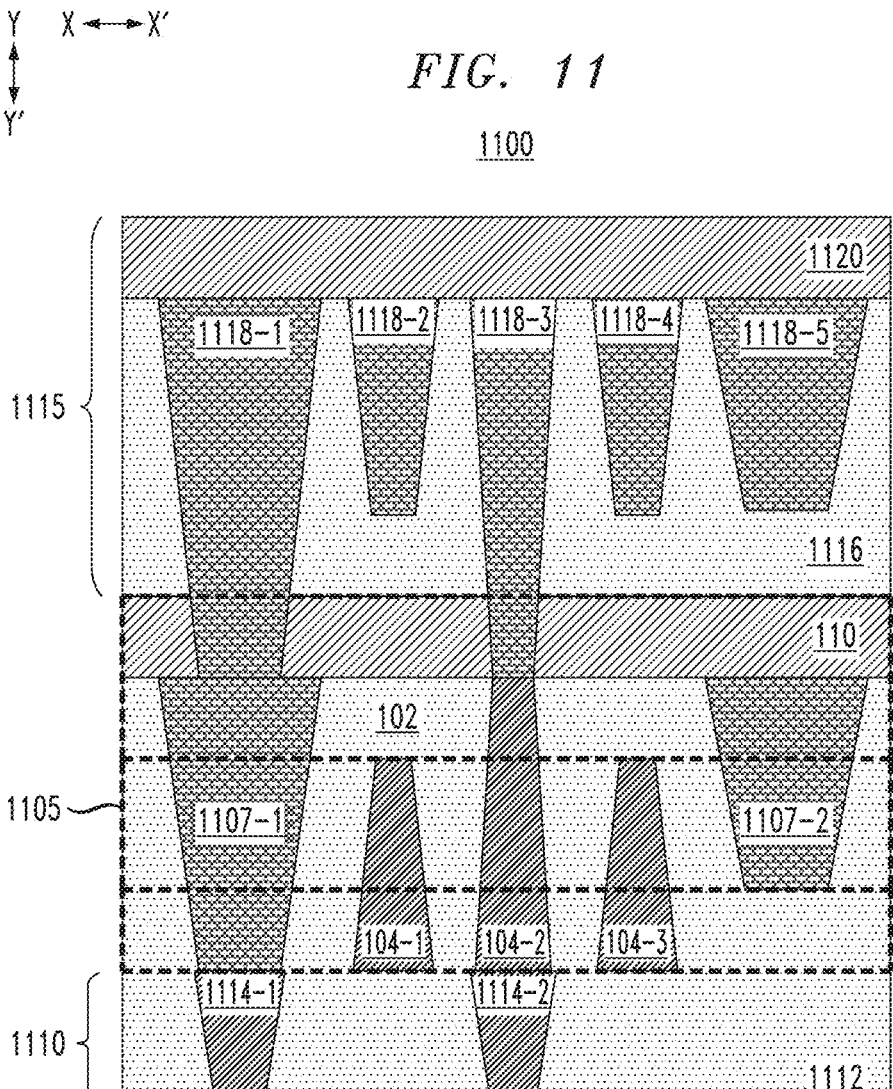
FIG. 11 depicts integration of the structure of FIG. 1 with additional back-end-of-line interconnect level structures, according to an embodiment of the invention.

FIG. 11 illustrates a cross-sectional view 1100, which illustrates how a module 1105 comprising the FIG. 1 structure is BEOL-stack compatible. For clarity of illustration in FIG. 11, the wide lines 108 and associated barrier layers 106 of the FIG. 1 structure are shown together as elements 1107-1 and 1107-2 (collectively, wide lines 1107). The module 1105 provides a metallization level (M1), which is formed over another module 1110 providing a via level (V0). The module 1110 includes an ILD layer 1112 (which may be formed of materials similar to that of ILD layer 112) in which V0 level vias 1114-1 and 1114-2 (collectively, vias 1114) are formed. The vias 1114 are illustratively formed using single damascene processing. The vias 1114 may be formed of Ru, Co or another suitable material. The vias 1114 may have respective widths (in direction X-X') that are similar to the 1× width narrow lines 104 in module 1105. The first via 1114-1 connects to wide line 108-1, while the second via 1114-2 connects to narrow line 104-2. The region of wide line 108-1 below the line 117-1 (shown in FIG. 1) provides a portion of the bottom via connecting to the V0 via level.

A module 1115 is formed over the module 1105 providing a metallization level (M2). The module 1115 includes an ILD layer 1116 (which may be formed of materials similar to that of ILD layer 1112) in which a set of lines 1118-1, 1118-2, 1118-3, 1118-4 and 1118-5 (collectively, lines 1118) are formed using dual damascene processing to provide the metallization level (M2). A dielectric capping layer 1120 (which may be formed of materials similar to that of the dielectric capping layer 110) is formed over the ILD layer 1116 and lines 1118. The lines 1118 may be formed using (N−1) or (N−2) lithography, and do not require extreme ultraviolet (EUV) lithography. The lines 1118 may include barrier layers on which a metal such as Cu is formed, similar to the wide lines 1107 (e.g., which comprise the barrier layers 106 and wide lines 108).

The lines 1118-1 and 1118-3 further extend through the dielectric capping layer 110 of the module 1105 to provide portions of vias of a via level (V1) that connect to the wide line 1107-1 and narrow line 104-2, respectively. The narrow line 104-2 advantageously has a top via portion (formed above the line 117-2 shown in FIG. 1) that also provides a portion of the V1 level via. As illustrated, there is a non-planar interface between: the M1 and V0 levels (e.g., as the wide line 108-1's bottom portion below line 117-1 provides a portion of the V0 level via, while the bottom of narrow line 104-1 is a line not a via region); the M1 and V1 levels (e.g., as the top of wide line 108-1 is a line not a via region, but the top of narrow line 104-2 above the line 117-2 at the same planar level is a portion of the V1 via region).

Figure 12:
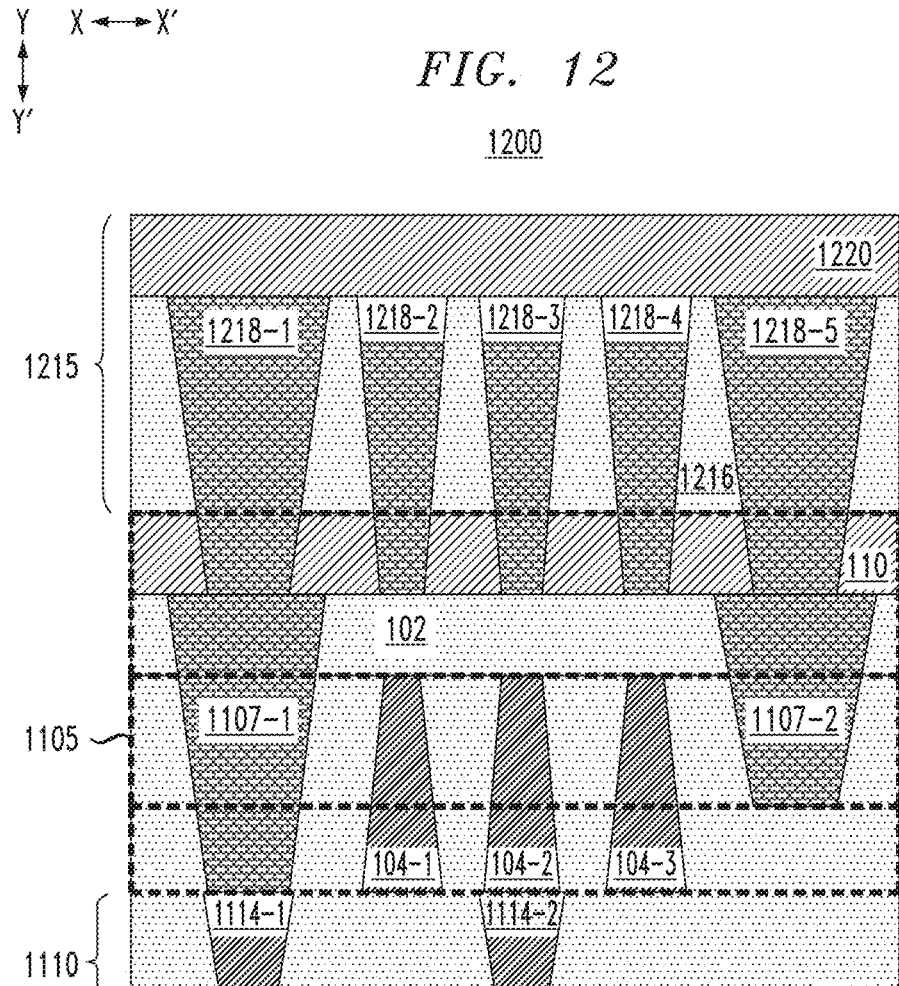
FIG. 12 depicts another integration of the structure of FIG. 1 with additional back-end-of-line interconnect level structures, according to an embodiment of the invention.

FIG. 12 illustrates a cross-sectional view 1200, which similarly illustrates how the module 1105 comprising the structure of FIG. 1 is BEOL-stack compatible. Whereas FIG. 11 shows an embodiment where the module 1115 formed above the module 1105 utilizes dual damascene processing, this is not a requirement. FIG. 12 shows an example where a module 1215 formed above the module 1105 uses single damascene processing. The module 1215 is formed over the module 1105 providing a metallization level (M2). The module 1215 includes an ILD layer 1216 (which may be formed of materials similar to that of ILD layer 112) in which a set of lines 1218-1, 1218-2, 1218-3, 1218-4 and 1218-5 (collectively, lines 1218) are formed using single damascene processing to provide the metallization level (M2). A dielectric capping layer 1220 (which may be formed of materials similar to that of dielectric capping layer 110) is formed over the ILD layer 1216 and the lines 1218. The lines 1218 may include barrier layers on which a metal such as Cu is formed, similar to the wide lines 1107 (e.g., which comprise the barrier layers 106 and wide lines 108). In the FIG. 12 embodiment, a single damascene Cu level (of module 1215) lands above the module 1105, eliminating the need for etching via level (V1) in the dielectric capping layer 110. The power islands (e.g., lines 1218-1 and 1218-5 of module 1215) do not require V1 level vias to connect to the M1 power lines (wide lines 1107-1 and 1107-2). Further, the M2 signal lines (e.g., line 1218-3 of module 1215) can land directly on the V1 top via portion of narrow line 104-2.

Figure 13:
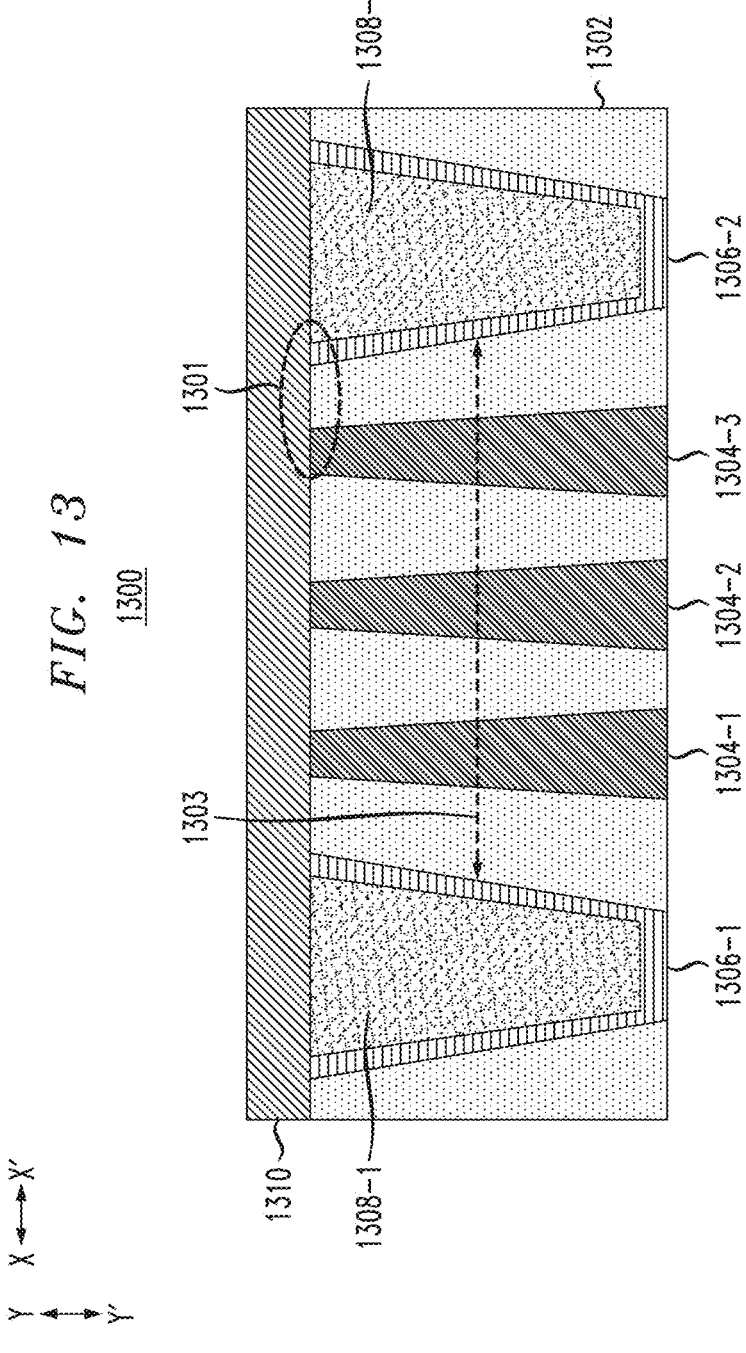
FIG. 13 depicts another cross-sectional view of a semiconductor structure providing hybrid damascene and subtractive etch processing integration for wide and narrow lines, according to an embodiment of the invention.

While the structure of FIG. 1 utilizes dual damascene processing to form the wide lines 108 (e.g., where the wide line 108-1 includes a bottom via portion in the region 115-1 below line 117-1), this is not a requirement. FIG. 13 shows a cross-sectional view 1300 of a semiconductor structure providing a standard cell architecture where single dama-scene processing is used for the wide lines. The elements in FIG. 12 are assumed to comprise the same materials with similar sizing as like-numbered elements in FIG. 1, except as otherwise noted.

FIG. 13 shows a cross-sectional view 1300 of a semicon-ductor structure providing a standard cell architecture with hybrid subtractive etch and damascene processing integra-tion for narrow and wide lines. The FIG. 13 structure includes ILD layer 1302, in which a set of narrow lines 1304-1, 1304-2 and 1304-3 (collectively, narrow lines 1304) are formed using subtractive etching. The FIG. 13 structure further includes wide lines 1308-1 and 1308-2 (collectively, wide lines 1308) formed using damascene processing. The wide lines 1308-1 and 1308-2 include respective barrier layers 1306-1 and 1306-2 (collectively, barrier layers 1306). A dielectric capping layer 1310 is formed over the ILD layer 1302, the wide lines 1308, and the narrow lines 1304. The ILD layer 1302 provides a single metallization layer for a standard cell that includes the multiple narrow lines 1304 formed between the wide lines 1308. It should be noted that while FIG. 13 shows an example with three narrow lines 1304, this is not a requirement. More generally, the standard cell architecture includes N narrow lines 1304 between the wide lines 1308, where N≥2.

Whereas different ones of the narrow lines 104 in the FIG. 1 structure have different heights (in direction Y-Y'), the narrow lines 1304 in the FIG. 13 structure have the same height (in direction Y-Y'), and do not include "top" via portions or regions. Similarly, whereas different ones of the wide lines 108 in the FIG. 1 structure have different heights (in direction Y-Y'), the wide lines 1308 in the FIG. 13 structure have the same height (in direction Y-Y'), and do not include "bottom" via portions or regions. The height (in direction Y-Y') of the narrow lines 1304 and the wide lines 1308 may be in the range of 10-30 nm (e.g., approximately double the width of the narrow lines 1304). Like the FIG. 1 structure, the FIG. 13 structure in some embodiments is assumed to have 1× width narrow lines 1304 and 3× width wide lines 1308.

Figure 14:
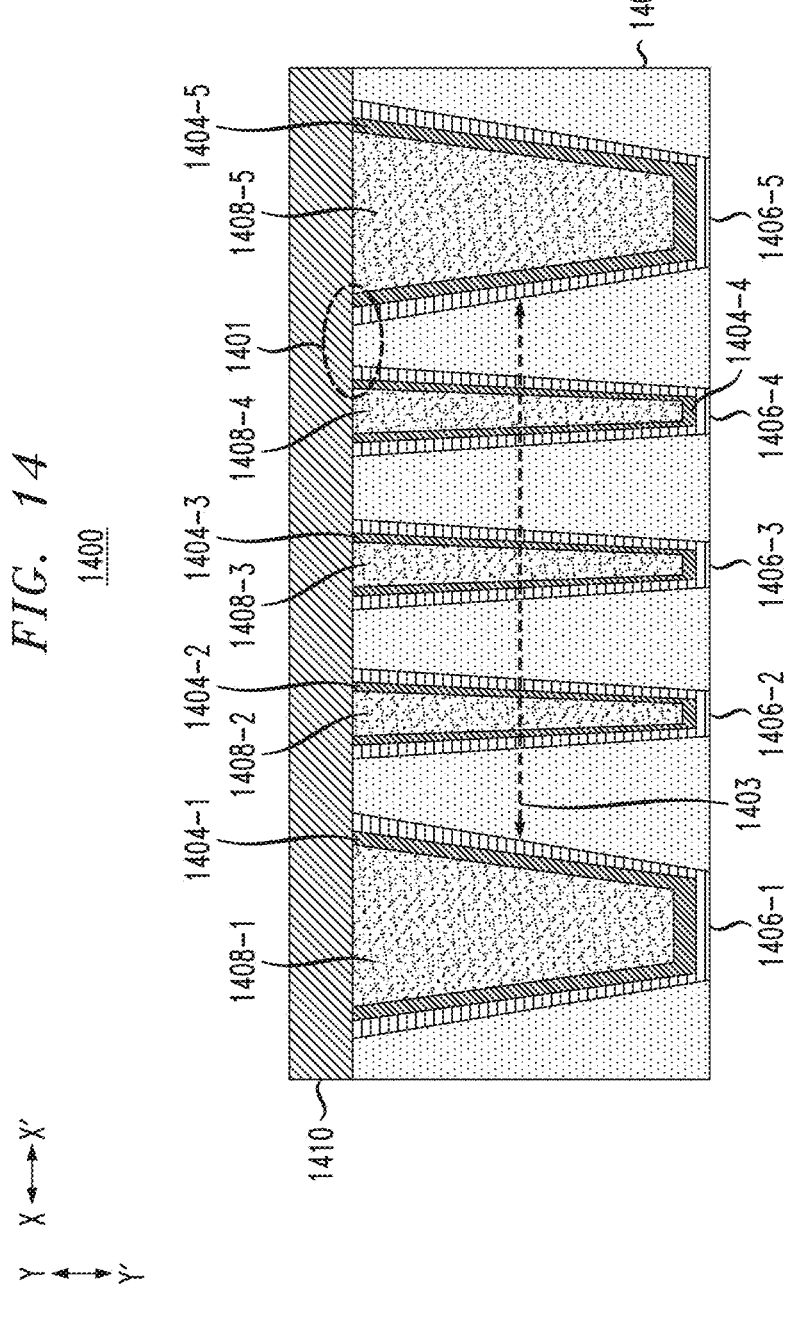
FIG. 14 depicts a cross-sectional view of a semiconductor structure utilizing damascene processing for formation of both wide and narrow lines using a same metal, according to an embodiment of the invention.
Figure 15:
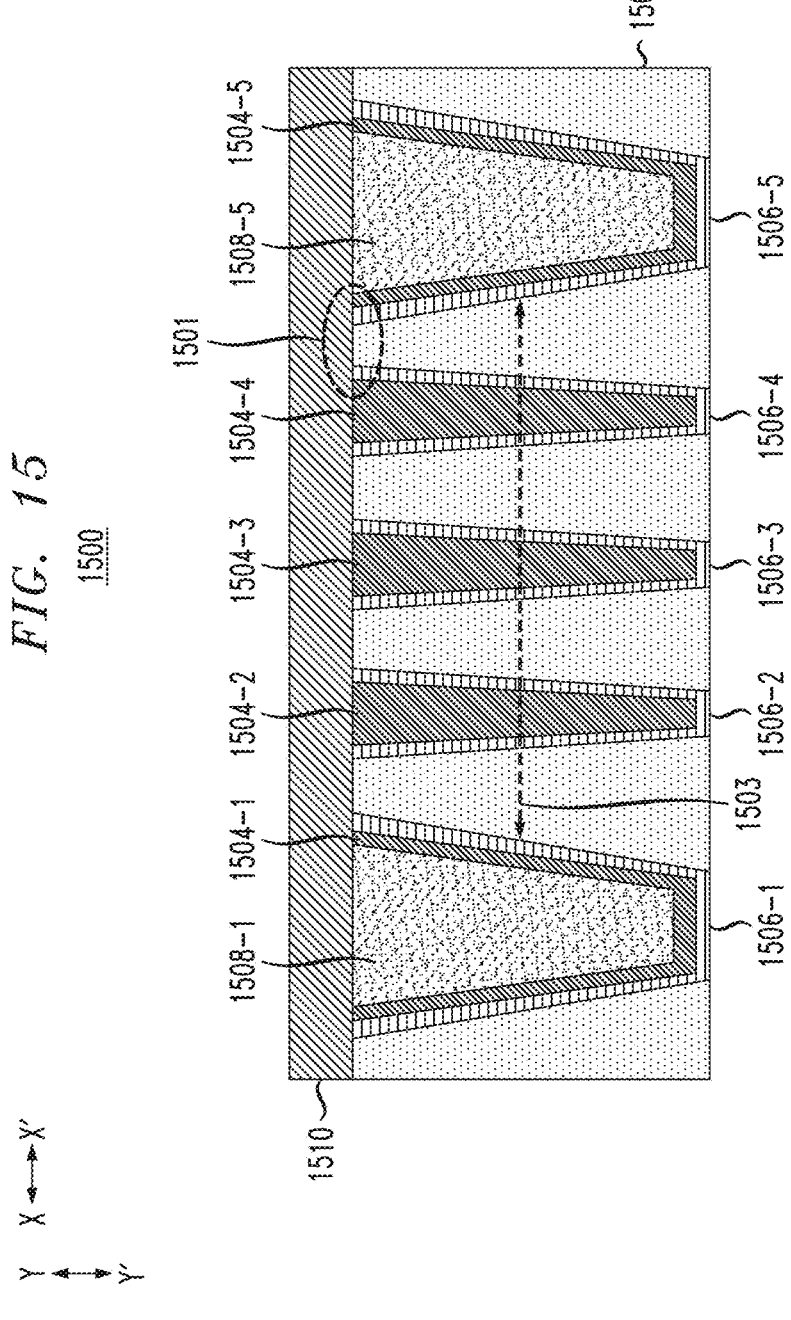
FIG. 15 depicts a cross-sectional view of a semiconductor structure utilizing damascene processing for formation of both wide and narrow lines using two metals, according to an embodiment of the invention.

FIGS. 14 and 15 show respective cross-sectional views 1400 and 1500 of semiconductor structures providing stan-dard cell architectures where single damascene processing is used for both narrow and wide lines. FIG. 14 shows a structure where the damascene processing uses one metal, while FIG. 15 shows a structure where the damascene processing uses two metals (e.g., composite metallization).

The FIG. 14 structure includes ILD layer 1402, in which both narrow and wide lines are formed using damascene processing. Barrier layers 1406-1, 1406-2, 1406-3, 1406-4 and 1406-5 (collectively, barrier layers 1406) are formed in both wide and narrow trenches. First metal layers 1404-1, 1404-2, 1404-3, 1404-4 and 1404-5 (collectively, first metal layers 1404) are filled over the barrier layers 1406, and second metal layers 1408-1, 1408-2, 1408-3, 1408-4 and 1408-5 (collectively, second metal layers 1408) are filled over the first metal layers 1404. The first metal layers 1404 may comprise Ru or another non-Cu material, and the second metal layers 1408 may comprise Cu, and thus both the narrow lines and the wide lines are formed of the same metal material. As discussed above with respect to FIGS. 3A-3C, this has various disadvantages.

The FIG. 15 structure includes ILD layer 1502, in which both narrow and wide lines are formed using damascene processing. Barrier layers 1506-1, 1506-2, 1506-3, 1506-4 and 1506-5 (collectively, barrier layers 1506) are formed in both wide and narrow trenches. A first metal material is then formed, resulting in the metal layers 1504-1, 1504-2, 1504-3, 1504-4 and 1504-5 (collectively, metal layers 1504) in each of the narrow and wide trenches. The metal layers 1504-2, 1504-3 and 1504-4 completely fill the narrow trenches, but the metal layers 1504-1 and 1504-5 do not completely fill the wide trenches. The metal layers 1504 may be formed of Ru, Co or another suitable material with an optimized line resistance for narrow lines. Metal layers 1508-1 and 1508-5 (collectively, metal layers 1508) are formed to fill the remainder of the wide trenches. The metal layer 1508 may be formed of Cu or another suitable material with an optimized line resistance for wide lines. The dama-scene Cu metallization (e.g., of metal layers 1508 in the wide trenches for wide lines) in the FIG. 15 structure requires prior deposition of both the barrier layer 1506 material (e.g., TaN) and the material of the metal layers 1504 (e.g., Ru), thus reducing the overall Cu volume in the wide lines and increasing line resistance. Further, the damascene Ru metallization (e.g., of metal layers 1504) requires deposition of an adhesion liner (e.g., barrier layers 1506) reducing the Ru volume and increasing line resistance in the narrow lines (e.g., metal layers 1504-2, 1504-3 and 1504-4 in the narrow trenches).

The FIG. 13 structure thus provides various advantages relative to the structures shown in FIGS. 14 and 15. The damascene integration of Cu wide lines 1308 only in the FIG. 13 structure means no wetting layer is needed (e.g., no Ru, only the TaN barrier layers 1306), maximizing Cu volume in the wide lines 1308 and decreasing line resistance. Further, the subtractive etch processing of Ru/Co in the narrow lines 1304 requires no wetting layer on the sidewalls (only at the bottom of the line), maximizing Ru/Co volume in the narrow lines 1304 and decreasing line resistance.

In addition, the FIG. 13 structure (as well as the FIG. 1 structure) provides density improvements relative to the structures of FIGS. 14 and 15. In the FIG. 13 and FIG. 1 structures, the narrow lines 1304 and 104 have a smaller top surface critical dimension (CD), such that the wide lines 1308 and 108 can be etched closer to the narrow lines while maintaining the same MinIns/Vmax, allowing a reduction in the standard cell library height. The smaller top surface CD of the wide lines 1308 is highlighted in region 1301 in the FIG. 13 structure, as compared with the top surface CD of the wide lines (e.g., second metal layers 1408 and metal layers 1508) in the FIG. 14 and FIG. 15 structures as highlighted in regions 1401 and 1501. Further, the overall space between the wide lines 1308, denoted by line 1303, may be made smaller than the overall space between the wide lines (e.g., second metal layers 1408 and metal layers 1508) in the FIG. 14 and FIG. 15 structures as denoted by lines 1403 and 1503.

Figure 16:
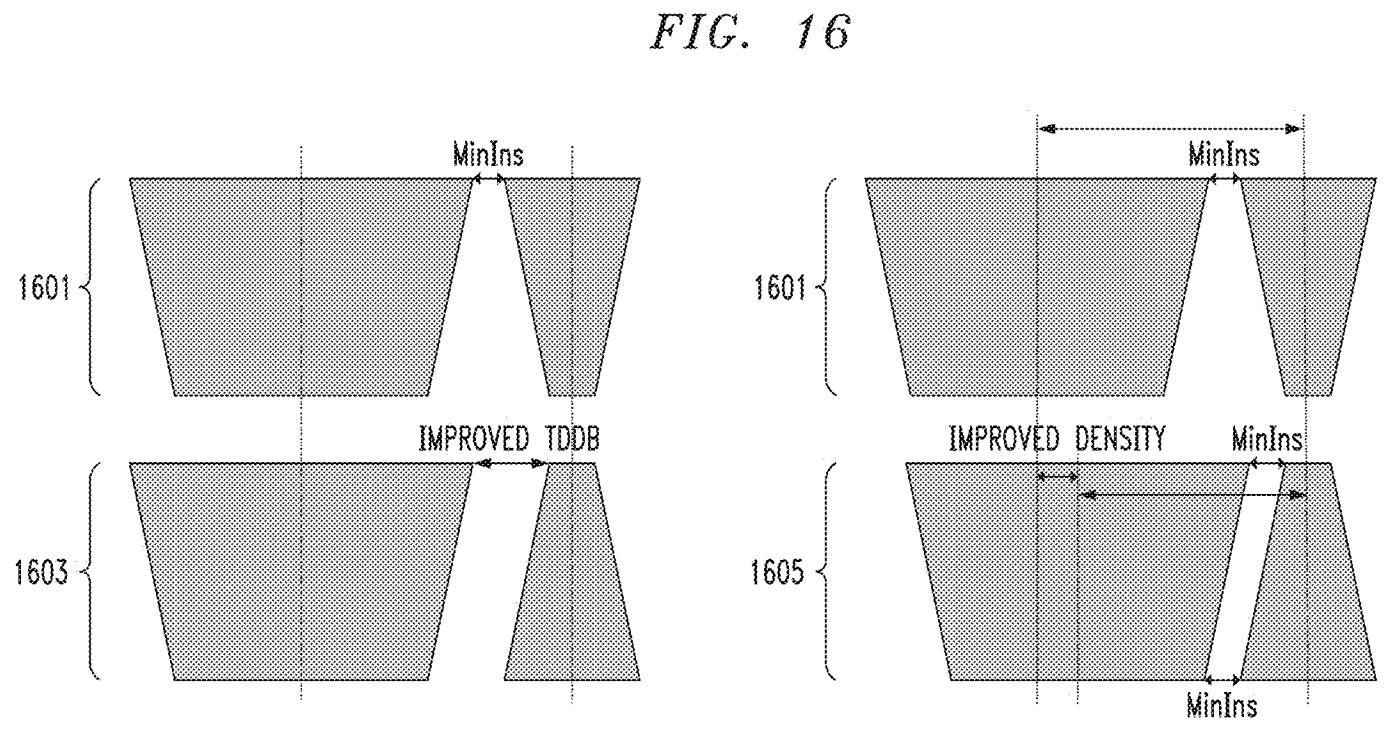

FIG. 16 illustrates density improvements of forming wide lines with damascene profiles (e.g., which taper downwards) next to narrow lines with subtractive etching profiles (e.g., which taper upwards). More particularly, FIG. 16 shows a first structure 1601 that, similar to the FIG. 14 and FIG. 15 structures, has damascene profiles of wide and narrow lines adjacent one another. This leads to a certain minimum insulator width (MinIns) at the top surface which gradually increases towards the bottom surface (e.g., the bottom surface insulator of the ILD material is wider than the top surface insulator of the ILD material between the adjacent wide and narrow lines). The second structure 1603, similar to the FIG. 1 and FIG. 13 structures, has a damascene profile wide line adjacent a subtractive etch profile narrow line, can have a uniform thickness of insulator material (e.g., ILD material) between the adjacent wide and narrow line. This advantageously provides improved Time Dependent Dielectric Breakdown (TDDB). The third structure 1605 of FIG. 16 illustrates that, for the same MinIns value as the structure 1601, improved density is provided by the hybrid damascene and subtractive etch processing integration used in the FIG. 1 and FIG. 13 structures (e.g., as compared with the structure 1601 that has adjacent wide and narrow lines both having damascene profiles).

FIGS. 17-22 show a process flow for forming the standard cell architecture structure of FIG. 13.

Figure 17:
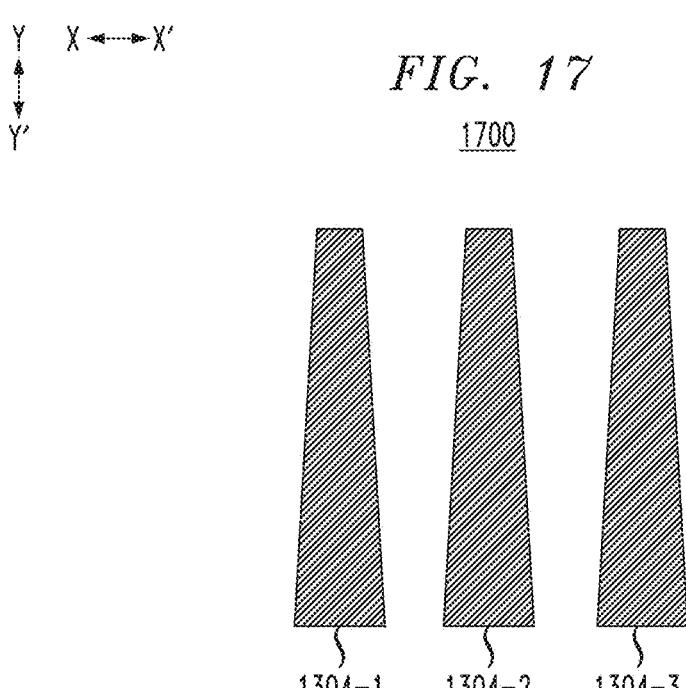
FIG. 17 depicts a cross-sectional view of a semiconductor structure following subtractive etch processing formation of narrow lines, according to an embodiment of the invention.

FIG. 17 shows a cross sectional view 1700 of subtractive etch formation of the narrow lines 1304. Initially, a material of the narrow lines 1304 (e.g., Ru) may be blanket deposited, followed by subtractive etch processing which forms the narrow lines 1304.

Figure 18:
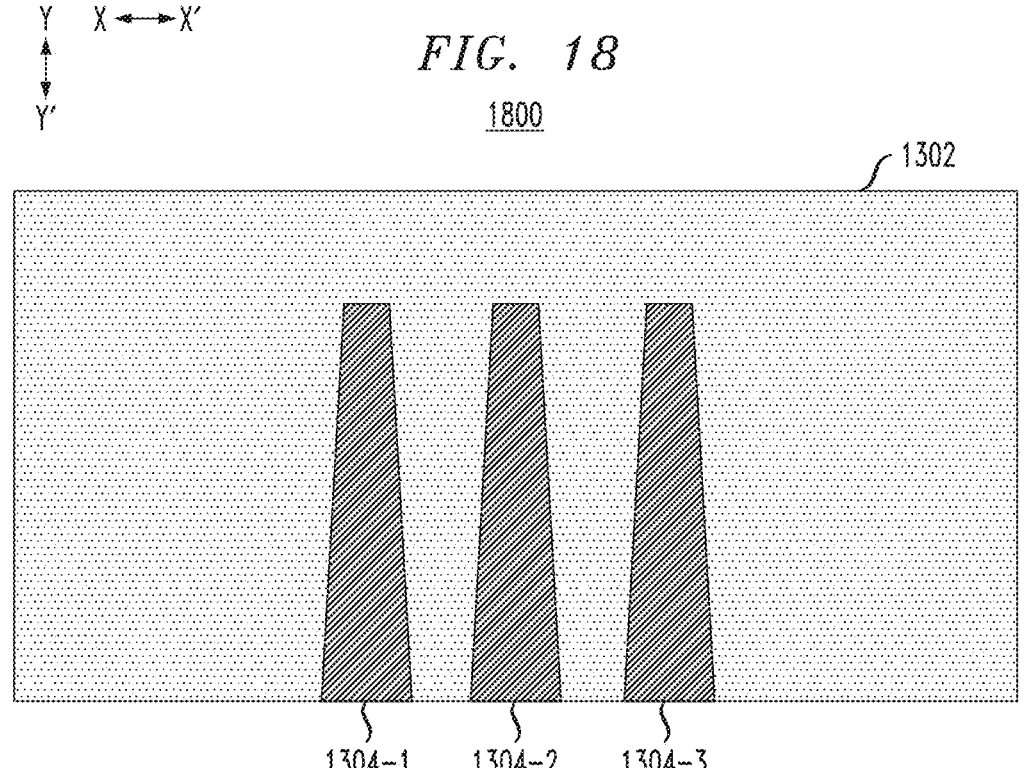
FIG. 18 depicts a cross-sectional view of the FIG. 17 structure following deposition of an interlevel dielectric layer, according to an embodiment of the invention.

FIG. 18 shows a cross-sectional view 1800 of the FIG. 17 structure following formation of the ILD layer 1302. The ILD layer 1302 is formed to overfill the structure. The ILD layer 1302 may be formed using any suitable deposition technique.

Figure 19:
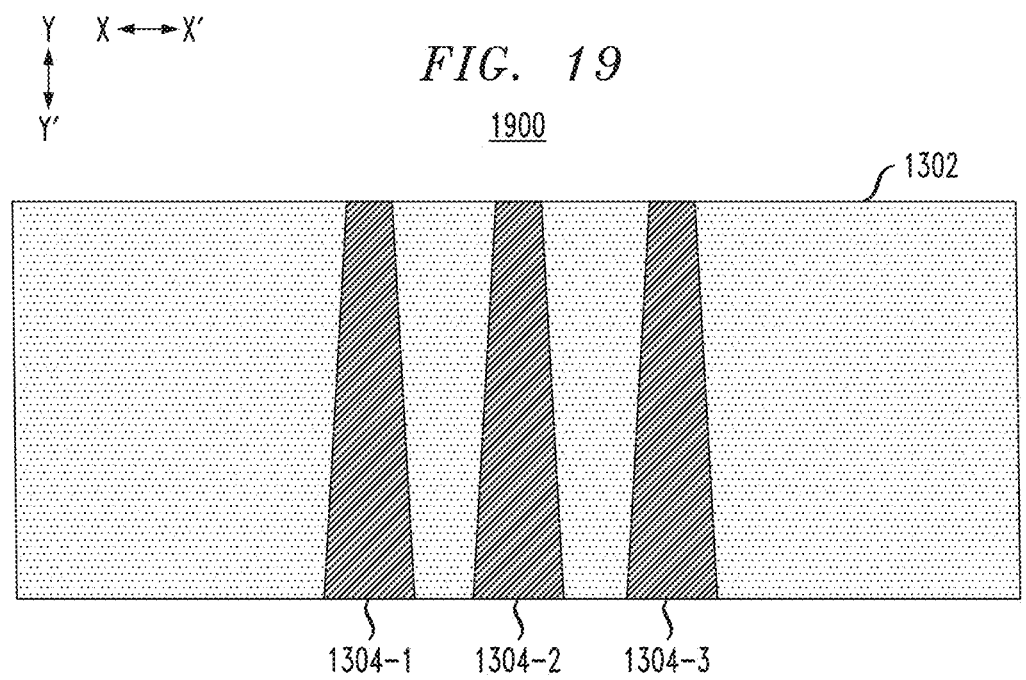
FIG. 19 depicts a cross-sectional view of the FIG. 18 structure following planarization of the interlevel dielectric layer, according to an embodiment of the invention.

FIG. 19 shows a cross-sectional view 1900 of the FIG. 18 structure following CMP processing. The CMP processing exposes the tops of the narrow line 1304 as illustrated.

Figure 20:
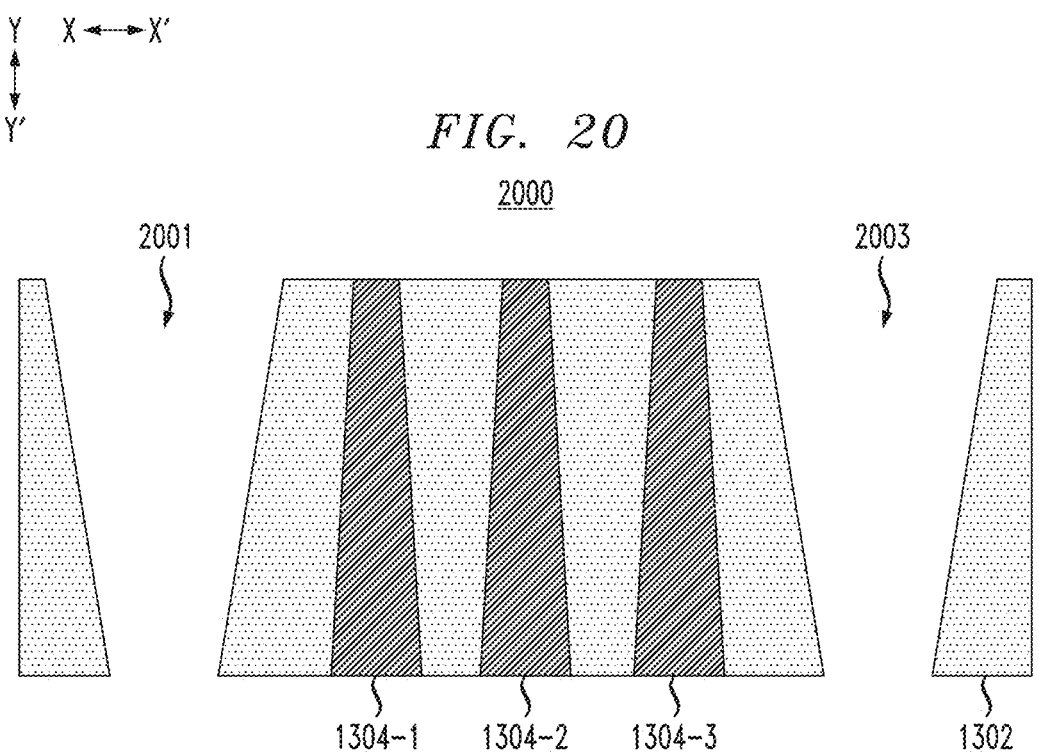
FIG. 20 depicts a cross-sectional view of the FIG. 19 structure following formation of trenches for wide lines, according to an embodiment of the invention.

FIG. 20 shows a cross-sectional view 2000 of the FIG. 19 structure following formation of trenches 2001 and 2003 for the wide lines 1308. The trenches 2001 and 2003 may be formed using lithography and etch processing. Although not shown, optional wet clean processing (e.g., similar to 801 shown in FIG. 8) may then be performed.

Figure 21:
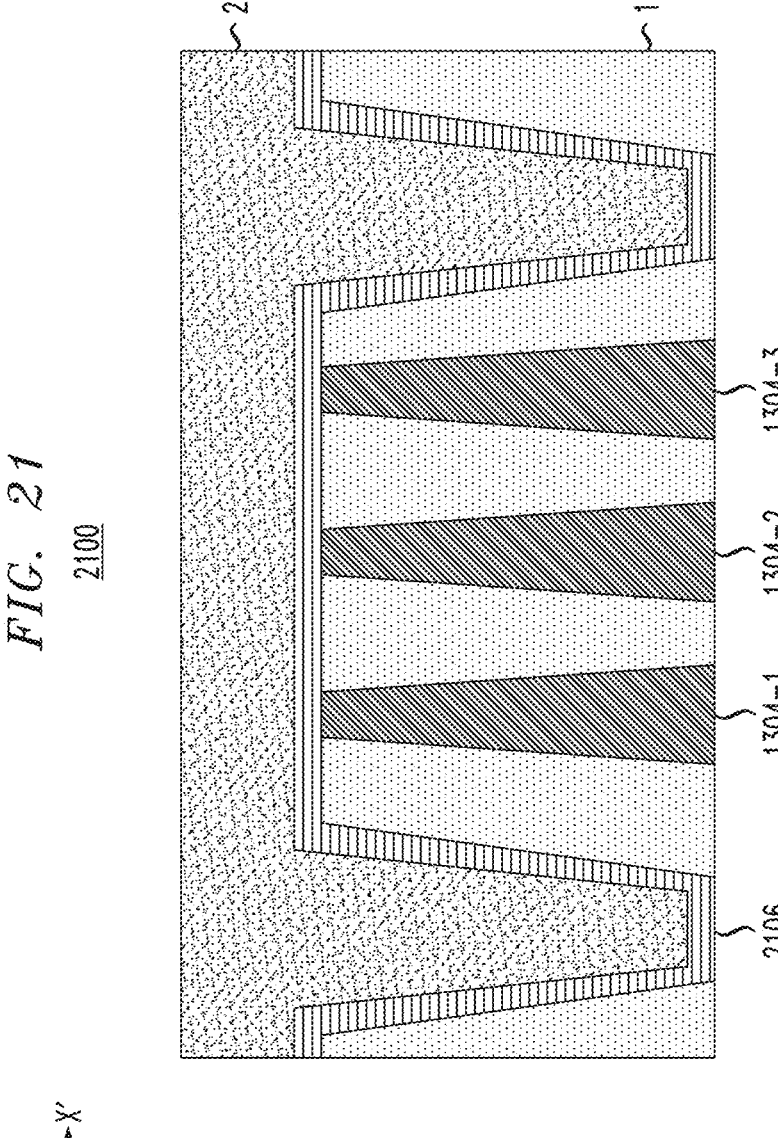
FIG. 21 depicts a cross-sectional view of the FIG. 20 structure following formation of a barrier material and wide line material, according to an embodiment of the invention.

FIG. 21 shows a cross-sectional view 2100 of the FIG. 20 structure following formation of material 2106 of the barrier layers 1306 and material 2108 of the wide lines 1308. The material 2106 may be formed initially using a conformal deposition process, followed by formation of the material 2108. The material 2108 may be formed using a Cu electroplating fill process.

Figure 22:
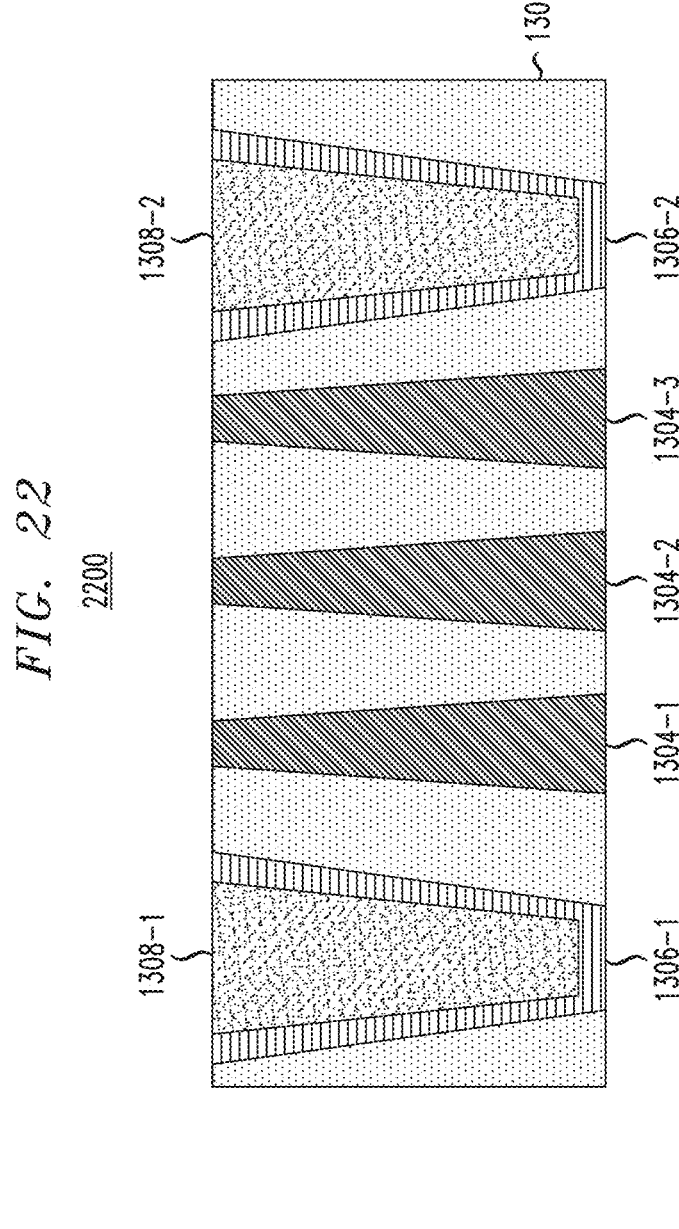
FIG. 22 depicts a cross-sectional view of the FIG. 21 structure following planarization to form wide lines from the barrier material and wide line material, according to an embodiment of the invention.

FIG. 22 shows a cross-sectional view 2200 of the FIG. 21 structure following CMP to remove portions of the material 2106 and 2108 that overfill the structure (e.g., CMP stops on the tops of the narrow lines 1304). The dielectric capping layer 1310 may then be deposited to result in the structure shown in FIG. 13.

Figure 23:
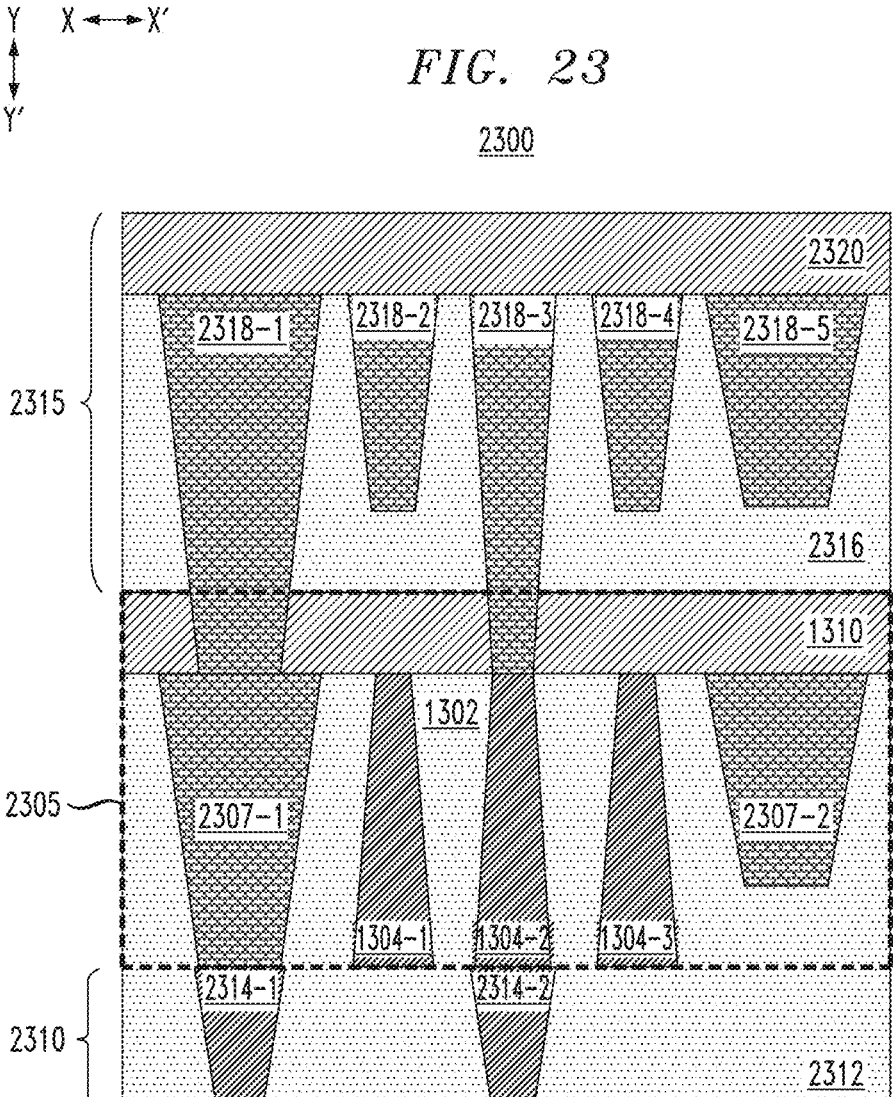
FIG. 23 depicts integration of the structure of FIG. 13 with additional back-end-of-line interconnect level structures, according to an embodiment of the invention.

FIG. 23 illustrates a cross-sectional view 2300, which illustrates how a module 2305 comprising the FIG. 13 structure is BEOL-stack compatible. For clarity of illustration in FIG. 23, the wide lines 1308 and associated barrier layers 1306 of the FIG. 13 structure are shown together as elements 2307-1 and 2307-2 (collectively, wide lines 2307). The module 2305 provides a metallization layer (M1), which is formed over another module 2310 providing a via level (V0). The module 2310 includes an ILD layer 2312 (which may be formed of materials similar to that of ILD layer 1312) in which V0 level vias 2314-1 and 2314-2 (collectively, vias 2314) are formed. The vias 2314 are illustratively formed using single damascene processing. The vias 2314 may be formed of Ru, Co or another suitable material. The vias 2314 may have respective widths (in direction X-X') that are similar to the 1x width narrow lines 1304 in module 2305. The first via 2314-1 connects to wide line 1307-1, while the second via 2314-2 connects to narrow line 1304-2.

A module 2315 is formed over the module 2305 providing a metallization level (M2). The module 2315 includes an ILD layer 2316 (which may be formed of materials similar to that of ILD layer 1312) in which a set of lines 2318-1, 2318-2, 2318-3, 2318-4 and 2318-5 (collectively, lines 2318) are formed using dual damascene processing to provide the metallization level (M2). A dielectric capping layer 2320 (which may be formed of materials similar to that of the dielectric capping layer 1310) is formed over the ILD layer 2316 and lines 2318. The lines 2318 may include barrier layers on which a metal such as Cu is formed, similar to the wide lines 2307 (e.g., which comprise the barrier layers 1306 and wide lines 1308). The lines 2318-1 and 2318-3 further extend through the dielectric capping layer 1310 of the module 2305 providing vias for a via level (V1) to connect to the wide line 2307-1 and narrow line 1304-2, respectively.

Figure 24A:
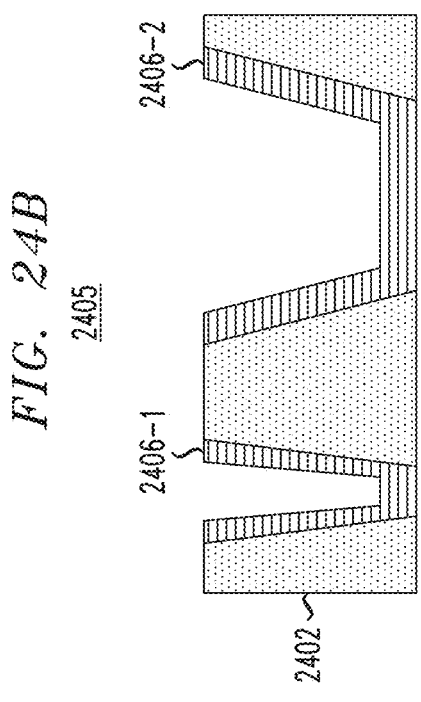
FIGS. 24A-24D depict a process flow for composite metallization of wide and narrow lines, according to an embodiment of the invention.
Figure 24B:
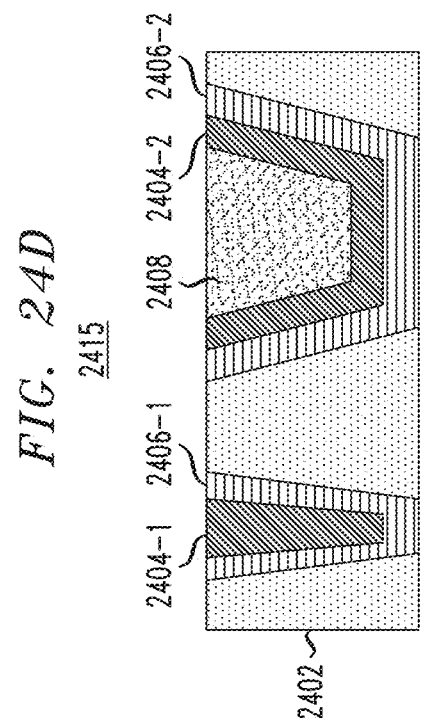
Figure 24C:
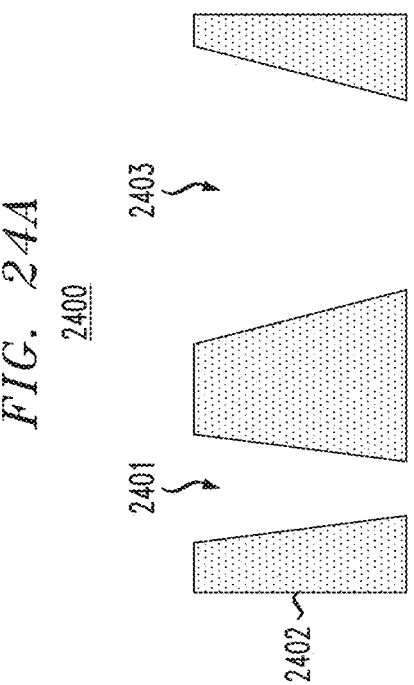
Figure 24D:
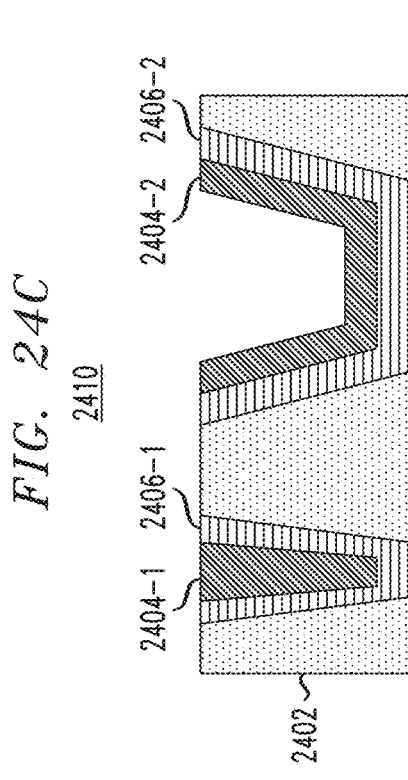

FIGS. 24A-24D show a process flow for composite metallization of wide and narrow lines. FIG. 24A shows a cross-sectional view 2400, illustrating an ILD layer 2402 in which trenches 2401 and 2403 are formed for a narrow and a wide line, respectively. FIG. 24B shows a cross-sectional view 2405 of the FIG. 24A structure, following deposition of barrier layers 2406-1 and 2406-2. FIG. 24C shows a cross-sectional view 2410 of the FIG. 24B structure, following deposition of a metal layers 2404-1 and 2404-2 (collectively, metal layers 2404). The metal layers 2404 may be formed of Ru, Co or another material that is optimized for line resistance of narrow lines. The metal layer 2404-1 completely filles the remainder of trench 2401, but does not completely fill the remainder of trench 2403. It should be noted that the metal layer 2404-2 is not needed in the wide line, but is required by the process flow of the composite metallization scheme. FIG. 24D shows a cross-sectional view 2415 of the FIG. 24C structure following fill of the remainder of the wide line trench 2403 with metal layer 2408. The metal layer 2408 may be formed of Cu or another material that is optimized for line resistance of wide lines. Here, there is limited volume of the metal layer 2408 in the wide line trench 2403, due to the presence of the metal layer 2404-2.

Figure 25A:
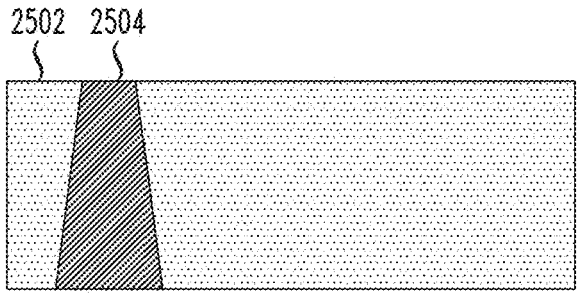
FIGS. 25A-25D depict a process flow for hybrid damascene and subtractive etch processing integration for wide and narrow lines, according to an embodiment of the invention.
Figure 25B:
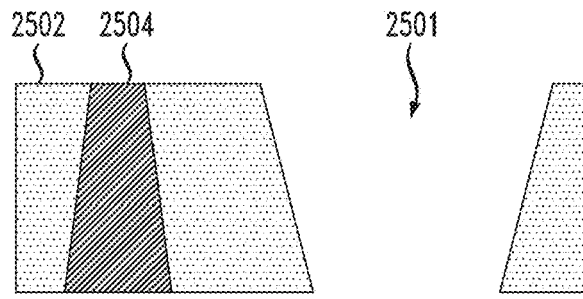
Figure 25C:
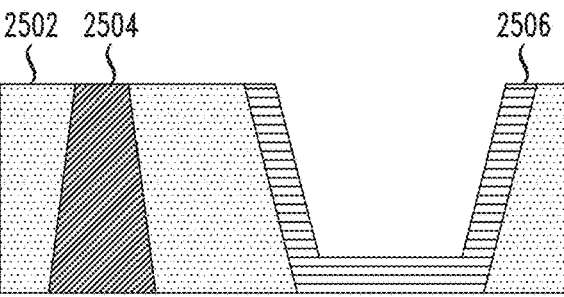
Figure 25D:
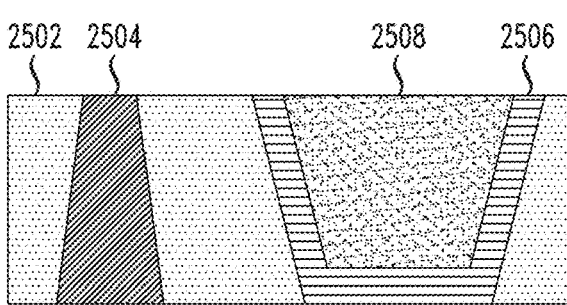

FIGS. 25A-25D show a process flow for hybrid damascene and subtractive etch processing integration for wide and narrow lines. FIG. 25A shows a cross-sectional view 2500, illustrating a metal layer 2504 for a narrow line that is formed using subtractive etch processing, and which is then surrounded by ILD layer 2502. FIG. 25B shows a cross-sectional view 2505 of the FIG. 25A structure following formation of a wide line trench 2501 (e.g., using lithography and etch processing). FIG. 25C shows a cross-sectional view 2510 of the FIG. 25B structure following deposition of barrier layer 2506 in the wide line trench 2501. FIG. 25D shows a cross-sectional view 2515 of the FIG. 25C structure following deposition of metal layer 2508 in the remainder of the wide line trench 2501. Advantageously, the metal layer 2508 (e.g., which is formed of Cu or another material that is optimized for line resistance of wide lines) fills a greater area of the wide line trench 2501 as compared with the metal layer 2408 filled in wide line trench 2403, as there is no metal layer 2404-2 in the wide line trench 2501.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 26:
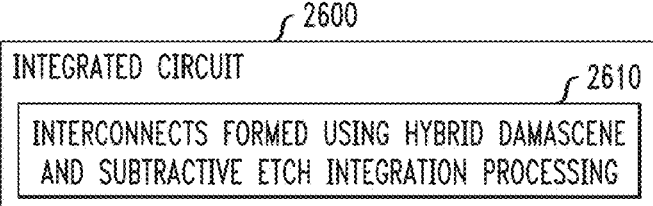
FIG. 26 depicts an integrated circuit comprising semiconductor structures with wide and narrow line interconnects formed using integrated hybrid damascene and subtractive etch processing, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 26 shows an example integrated circuit 2600 which includes one or more semiconductor structures 2610 with wide and narrow line interconnects formed using hybrid damascene and subtractive etch integration processing.

In some embodiments, a semiconductor structure comprises two or more interconnect lines of a first width in a given interconnect level, and two or more interconnect lines of a second width in the given interconnect level. The two or more interconnect lines of the second width are disposed between a first one of the two or more interconnect lines of the first width and a second one of the two or more interconnect lines of the second width. The two or more interconnect lines of the first width have sidewalls with a negative taper angle. The two or more interconnect lines of the second width have sidewalls with a positive taper angle.

The first width may be greater than the second width, such as the first width being at least three times greater than the second width.

The two or more interconnect lines of the first width may comprise power lines, and the two or more interconnect lines of the second width may comprise signal lines.

The two or more interconnect lines of the first width may utilize a copper conductor, and the two or more interconnect lines of the second width may utilize a non-copper conductor.

The two or more interconnect lines of the first width may have respective sidewall profiles that increase in width from bottom to top surfaces thereof, and the two or more interconnect lines of the second width may have respective sidewall profiles that decrease in width from top to bottom surfaces thereof.

The two or more interconnect lines of the first width may have damascene sidewall profiles, and the two or more interconnect lines of the second width may have subtractive-etch sidewall profiles.

At least one of the two or more interconnect lines of the first width may comprise a bottom via structure in the given interconnect level that is coincident with bottom portions of the two or more interconnect lines of the second width.

At least one of the two or more interconnect lines of the second width may comprise a top via structure in the given interconnect level coincident with top portions of the two more interconnect lines of the first width.

The two or more interconnect lines of the first width may comprise via structures in the given interconnect level located below the two or more interconnect lines of the first width, and the two or more interconnect lines of the second width may comprise via structures in the given interconnect level located above the two or more interconnect lines of the second width.

The semiconductor structure may further comprise an ILD layer surrounding the two or more interconnect lines of the first width and the two or more interconnect lines of the second width, and a dielectric capping layer disposed over the interlevel dielectric layer.

The semiconductor structure may further comprise at least one additional interconnect level disposed above the given interconnect level. The at least one additional interconnect level may comprise one or more interconnect lines with a dual damascene profile that contact at least one of one or more of the interconnect lines of the first width and one or more of the interconnect lines of the second width through via structures disposed through the dielectric capping layer. The at least one additional interconnect level may alternatively comprise one or more interconnect lines with a damascene profile disposed through the dielectric capping layer which directly contact at least one of: one or more of the interconnect lines of the first width; and one or more top via structures in the first interconnect level that are located above one or more of the two or more interconnect lines of the second width.

In some embodiments, an integrated circuit comprises a back-end-of-line interconnect structure comprising two or more interconnect levels. At least a given one of the two or more interconnect levels comprises two or more interconnect lines of a first width and two or more interconnect lines of a second width. The two or more interconnect lines of the second width are disposed between a first one of the two or more interconnect lines of the first width and a second one of the two or more interconnect lines of the second width. The two or more interconnect lines of the first width have sidewalls with a negative taper angle. The two or more interconnect lines of the second width have sidewalls with a positive taper angle.

The first width may be greater than the second width, such as the first width being at least three times greater than the second width.

The two or more interconnect lines of the first width may utilize a copper conductor, and the two or more interconnect lines of the second width may utilize a non-copper conductor.

The two or more interconnect lines of the first width may comprise via structures in the given interconnect level located below the two or more interconnect lines of the first width, and the two or more interconnect lines of the second width may comprise via structures in the given interconnect level located above the two or more interconnect lines of the second width.

In some embodiments, a method comprises forming two or more interconnect lines of a first width in a given interconnect level, and forming two or more interconnect lines of a second width in the given interconnect level. The two or more interconnect lines of the second width are disposed between a first one of the two or more interconnect lines of the first width and a second one of the two or more interconnect lines of the second width. The two or more interconnect lines of the first width have sidewalls with a negative taper angle. The two or more interconnect lines of the second width have sidewalls with a positive taper angle.

The first width may be greater than the second width, such as the first width being at least three times greater than the second width.

The two or more interconnect lines of the first width may be formed using damascene processing, and the two or more interconnect lines of the second width may be formed using subtractive etch processing.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:

two or more interconnect lines of a first width in a given interconnect level; and two or more interconnect lines of a second width in the given interconnect level;

wherein the two or more interconnect lines of the second width are disposed between a first one of the two or more interconnect lines of the first width and a second one of the two or more interconnect lines of the second width;

wherein the two or more interconnect lines of the first width have sidewalls with a negative taper angle;

wherein the two or more interconnect lines of the second width have sidewalls with a positive taper angle;

wherein the first one of the two or more interconnect lines of the first width comprises a bottom via structure in the given interconnect level that is coincident with bottom portions of each of the two or more interconnect lines of the second width in the given interconnect level; and wherein the second one of the two or more interconnect lines of the first width comprises a bottom via structure in the given interconnect level that is not coincident with the bottom portions of any of the two or more interconnect lines of the second width in the given interconnect level.

2. The semiconductor structure of claim 1, wherein the first width is greater than the second width.

3. The semiconductor structure of claim 1, wherein the first width is at least three times greater than the second width.

4. The semiconductor structure of claim 1, wherein the two or more interconnect lines of the first width comprise power lines, and wherein the two or more interconnect lines of the second width comprise signal lines.

5. The semiconductor structure of claim 1, wherein the two or more interconnect lines of the first width utilize a copper conductor, and wherein the two or more interconnect lines of the second width utilize a non-copper conductor.

6. The semiconductor structure of claim 1, wherein the two or more interconnect lines of the first width have respective sidewall profiles that increase in width from bottom to top surfaces thereof, and wherein the two or more interconnect lines of the second width have respective sidewall profiles that decrease in width from bottom to top surfaces thereof.

7. The semiconductor structure of claim 1, wherein the two or more interconnect lines of the first width have damascene sidewall profiles, and wherein the two or more interconnect lines of the second width have subtractive-etch sidewall profiles.

8. The semiconductor structure of claim 1, wherein at least one of the two or more interconnect lines of the second width comprises a top via structure in the given interconnect level coincident with top portions of the two or more interconnect lines of the first width.

9. The semiconductor structure of claim 1, wherein the two or more interconnect lines of the first width comprise via structures in the given interconnect level located below the two or more interconnect lines of the first width, and wherein the two or more interconnect lines of the second width comprise via structures in the given interconnect level located above the two or more interconnect lines of the second width.

10. The semiconductor structure of claim 1, further comprising:

an interlevel dielectric layer surrounding the two or more interconnect lines of the first width and the two or more interconnect lines of the second width; and a dielectric capping layer disposed over the interlevel dielectric layer.

11. The semiconductor structure of claim 10, further comprising at least one additional interconnect level disposed above the given interconnect level, and wherein the at least one additional interconnect level comprises one or more interconnect lines with a dual damascene profile that contact at least one of one or more of the interconnect lines of the first width and one or more of the interconnect lines of the second width through via structures disposed through the dielectric capping layer.

12. The semiconductor structure of claim 10, further comprising at least one additional interconnect level disposed above the given interconnect level, and wherein the at least one additional interconnect level comprises one or more interconnect lines with a damascene profile disposed through the dielectric capping layer which directly contact at least one of: one or more of the interconnect lines of the first width; and one or more top via structures in the given interconnect level that are located above one or more of the two or more interconnect lines of the second width.

13. An integrated circuit, comprising: a back-end-of-line interconnect structure comprising two or more interconnect levels; wherein at least a given one of the two or more interconnect levels comprises:

two or more interconnect lines of a first width; and two or more interconnect lines of a second width;

wherein the two or more interconnect lines of the second width are disposed between a first one of the two or more interconnect lines of the first width and a second one of the two or more interconnect lines of the second width; wherein the two or more interconnect lines of the first width have sidewalls with a negative taper angle; wherein the two or more interconnect lines of the second width have sidewalls with a positive taper angle; wherein the first one of the two or more interconnect lines of the first width comprises a bottom via structure in the given interconnect level that is coincident with bottom portions of each of the two or more interconnect lines of the second width in the given interconnect level; and wherein the second one of the two or more interconnect lines of the first width comprises a bottom via structure in the given interconnect level that is not coincident with the bottom portions of any of the two or more interconnect lines of the second width in the given interconnect level.

14. The integrated circuit of claim 13, wherein the first width is greater than the second width.

15. The integrated circuit of claim 13, wherein the two or more interconnect lines of the first width utilize a copper conductor, and wherein the two or more interconnect lines of the second width utilize a non-copper conductor.

16. The integrated circuit of claim 13, wherein the two or more interconnect lines of the first width comprise via structures in the given interconnect level located below the two or more interconnect lines of the first width, and wherein the two or more interconnect lines of the second width comprise via structures in the given interconnect level located above the two or more interconnect lines of the second width.

17. A method comprising:

forming two or more interconnect lines of a first width in a given interconnect level; and forming two or more interconnect lines of a second width in the given interconnect level;

wherein the two or more interconnect lines of the second width are disposed between a first one of the two or more interconnect lines of the first width and a second one of the two or more interconnect lines of the second width;

wherein the two or more interconnect lines of the first width have sidewalls with a negative taper angle;

wherein the two or more interconnect lines of the second width have sidewalls with a positive taper angle;

wherein the first one of the two or more interconnect lines of the first width comprises a bottom via structure in the given interconnect level that is coincident with bottom portions of each of the two or more interconnect lines of the second width in the given interconnect level; and wherein the second one of the two or more interconnect lines of the first width comprises a bottom via structure in the given interconnect level that is not coincident with the bottom portions of any of the two or more interconnect lines of the second width in the given interconnect level.

18. The method of claim 17, wherein the first width is greater than the second width.

19. The method of claim 17, wherein the two or more interconnect lines of the first width are formed using damascene processing, and wherein the two or more interconnect lines of the second width are formed using subtractive etch processing.

20. The method of claim 17, wherein at least one of the two or more interconnect lines of the second width comprises a top via structure in the given interconnect level coincident with top portions of the two or more interconnect lines of the first width.

* * * * *